(12) United States Patent
Fukunaga et al.

(10) Patent No.: US 8,402,415 B2
(45) Date of Patent: Mar. 19, 2013

(54) LAYOUT DEVICE AND LAYOUT METHOD OF SEMICONDUCTOR INTEGRATED CIRCUIT

(75) Inventors: Sawako Fukunaga, Kanagawa (JP);
Yuuki Takahashi, Kanagawa (JP);
Katsuhiro Yamashita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 55 days.

(21) Appl. No.: 13/039,955

(22) Filed: Mar. 3, 2011

(65) Prior Publication Data
US 2011/0219347 A1 Sep. 8, 2011

(30) Foreign Application Priority Data
Mar. 5, 2010 (JP) ................................ 2010-049350

(51) Int. Cl.
*G06F 17/50* (2006.01)
(52) U.S. Cl. ........ 716/126; 716/112; 716/115; 716/119; 716/122; 716/129; 716/130; 716/132; 716/136
(58) Field of Classification Search .................. 716/112, 716/115, 119, 122, 126, 129, 130, 132, 136
See application file for complete search history.

(56) References Cited

U.S. PATENT DOCUMENTS

| | | | | |
|---|---|---|---|---|
| 6,014,507 A * | 1/2000 | Fujii | ............................ | 716/129 |
| 6,240,541 B1 * | 5/2001 | Yasuda et al. | ................ | 716/112 |
| 6,330,707 B1 * | 12/2001 | Shinomiya et al. | ........... | 716/130 |
| 6,349,403 B1 * | 2/2002 | Dutta et al. | .................... | 716/129 |
| 6,415,427 B2 * | 7/2002 | Nitta et al. | ..................... | 716/129 |
| 6,519,750 B2 * | 2/2003 | Yamashita | ...................... | 716/122 |
| 6,691,296 B1 * | 2/2004 | Nakayama et al. | ........... | 716/122 |
| 7,739,646 B2 * | 6/2010 | Lin et al. | ....................... | 716/119 |
| 7,962,881 B2 * | 6/2011 | Buehler et al. | ................. | 716/126 |
| 8,095,903 B2 * | 1/2012 | Birch et al. | ..................... | 716/126 |
| 8,099,700 B1 * | 1/2012 | Waller et al. | ................... | 716/126 |
| 8,108,819 B2 * | 1/2012 | Alpert et al. | ................... | 716/122 |
| 8,171,441 B2 * | 5/2012 | McElvain et al. | ............. | 716/115 |
| 8,171,447 B1 * | 5/2012 | Balsdon et al. | ................ | 716/129 |
| 2001/0021992 A1 * | 9/2001 | Yamashita | ......................... | 716/8 |

FOREIGN PATENT DOCUMENTS

| JP | 2008-227198 A | | 9/2008 |
|---|---|---|---|
| JP | 2008227198 A | * | 9/2008 |

\* cited by examiner

*Primary Examiner* — Helen Rossoshek
(74) *Attorney, Agent, or Firm* — Sughrue Mion, PLLC

(57) ABSTRACT

A layout method of a semiconductor integrated circuit includes five steps. The first step is of extracting a wiring crowding place where wiring lines are crowded as compared with a predetermined condition, after carrying out a routing in a region where a placement of circuit elements is carried out. The second step is of generating routing prohibition regions where a routing is prohibited in an area including the wiring crowding place. The third step is of carrying out a routing by bypassing the routing prohibition regions. The fourth step is of deleting the routing prohibition regions. The fifth step is of carrying out a re-routing. The generating step includes: calculating a size and an interval of the routing prohibition regions based on a rate for generating a routing prohibition region in the area in each wiring layer, and generating the routing prohibition regions in the area on the basis of the calculating result.

18 Claims, 18 Drawing Sheets

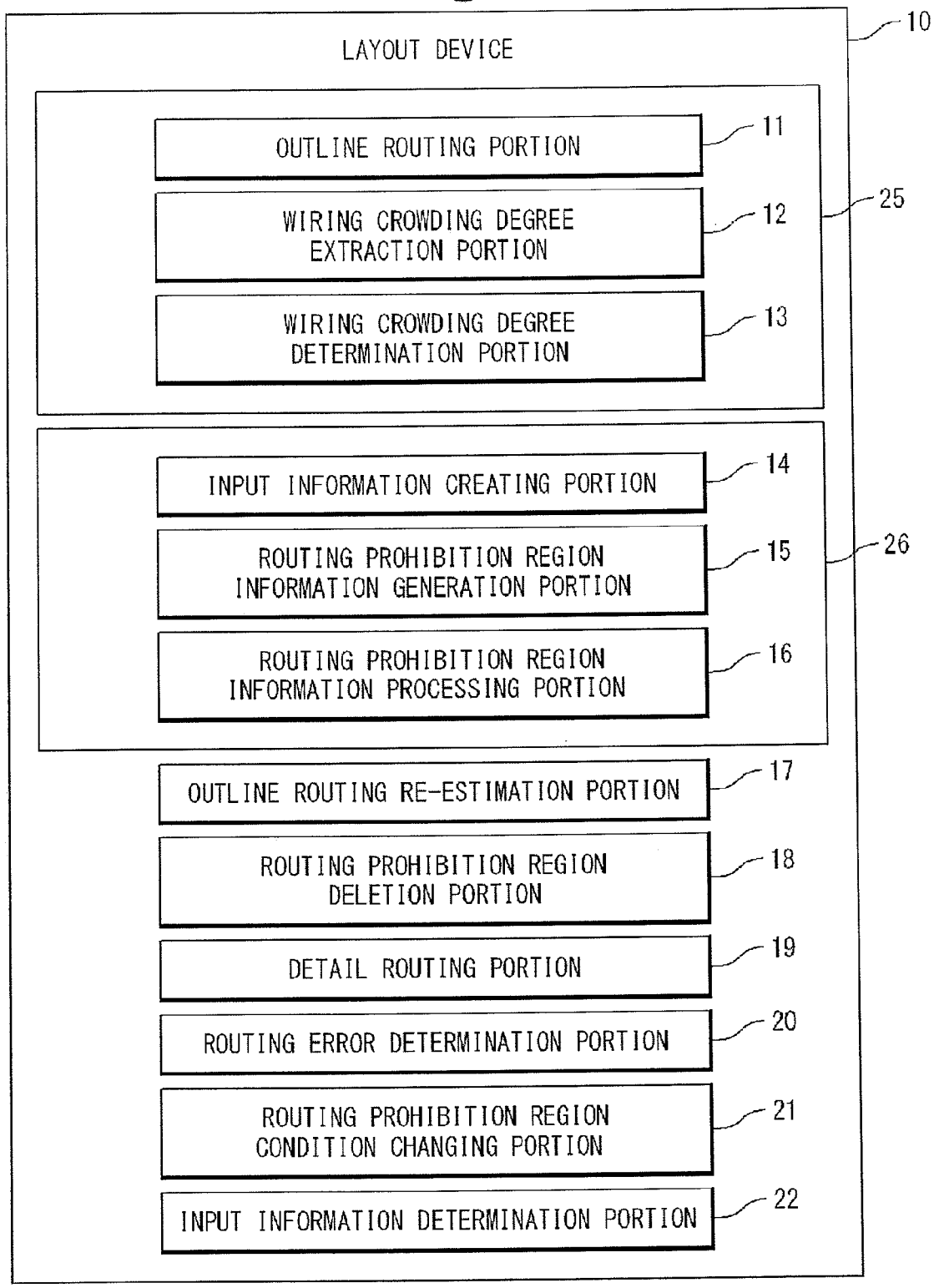

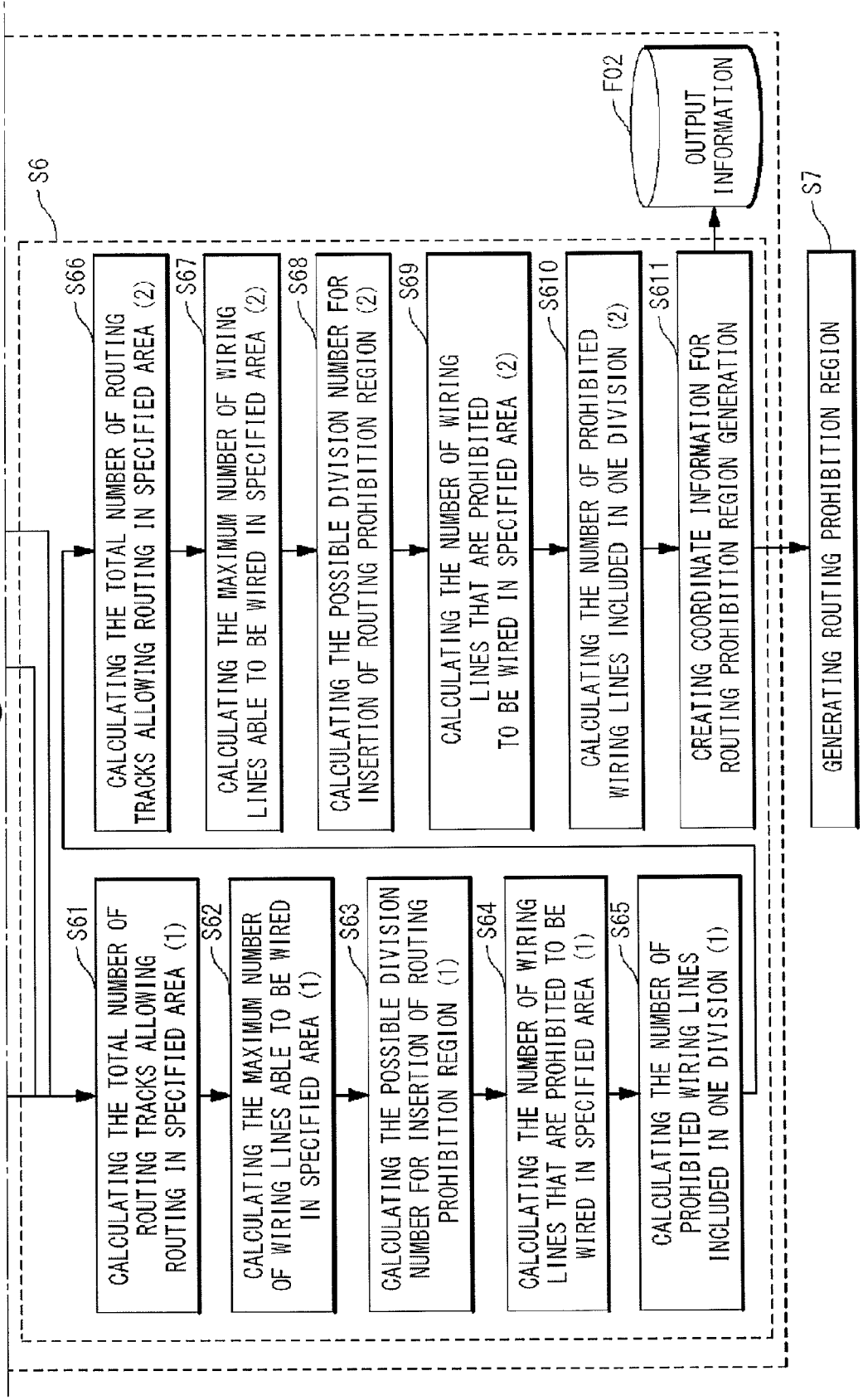

LAYOUT DEVICE AND LAYOUT METHOD OF SEMICONDUCTOR INTEGRATED CIRCUIT

INCORPORATION BY REFERENCE

This application is based upon and claims the benefit of priority from Japanese patent application No. 2010-049350 filed on Mar. 5, 2010, the disclosure of which is incorporated herein in its entirety by reference.

BACKGROUND OF THE INVENTION

1. Field of the Invention

The present invention relates to a layout device and a layout method of a semiconductor integrated circuit, and especially relates to a layout device and a layout method for crowded wiring of a semiconductor integrated circuit.

2. Description of the Related Art

In accordance with recent advancement of a microfabrication technique, high integration of an LSI is increasingly advanced. In addition, further faster operation is required. In a layout design of the LSI, it is known to carry out routing by using an automatic routing tool. In order to satisfy a timing of the high speed operation, the automatic routing tool carries out the shortest routing. However, volume of the wiring line included in one chip is increased due to the high integration of the LSI. Accordingly, there is a region such as a corner of a hard macro where there are many wiring lines whose routing paths are blocked and which are required to be bypassed and there is a region where wiring lines are crowed such as a wiring region where a high-speed signal exchange between a plurality of modules intersects. In the region where the wiring lines are crowded, following problems become increasingly prominent. One problem is a routing error caused because routing cannot be performed in a routing track completely (for example, short-circuiting or opening of a wiring line, a design rule violation and the like). The other problem is a timing problem that timing deteriorates because a wiring line is bypassed in order to avoid the routing error.

As a technique for preventing the deterioration of the timing caused by bypass routing, JP2008-227198A (Patent literature 1) discloses a layout design method of a semiconductor integrated circuit. The layout design method includes: a step of extracting a wiring crowding region from a required routing region and from an actually routing allowable region after performing placement of circuit elements constituting the semiconductor integrated circuit; a step of generating a routing prohibition region to the wiring crowding region; a step of carrying out an automatic routing while bypassing the wiring crowding region; and a step of carrying out the automatic routing again after deleting the routing prohibition region. That is, in order to avoid locally crowded wiring, a routing resource is preliminarily reserved at first by using the routing prohibition region. Then, in the initial routing, the automatic routing is carried out while the routing prohibition region is bypassed. Upon rerouting, the automatic routing is carried out after the routing prohibition region is deleted to release the routing resource.

The inventors have now discovered the following facts. A technique disclosed in JP2008-227198A has a problem that the number of routing errors increases after the automatic routing is carried out while the routing prohibition region is bypassed. For this reason, even when the automatic routing is carried out again after the routing prohibition region is deleted, there will be a problem that the number of the remaining routing errors that could not be corrected completely increases in proportion to increase of the routing error and additionally correction time of the routing error increases. A reason that the above-mentioned problem occurs will be described below.

As described above, the technique disclosed in JP2008-227198A firstly arranges circuit elements, carries out wiring estimation, specifies a region where wiring lines are crowded, and extracts coordinates covering the wiring crowding region. Then, the technique obtains an extension value by calculating the number of wiring lines that run short in the wiring crowding region, and generates the routing prohibition region by adding the obtained extension value to the coordinates covering the extracted wiring crowding region. Subsequently, the technique carries out the automatic routing so as to bypass the routing prohibition region. After that, the technique deletes the routing prohibition region, and carries out the rerouting to the reserved routing resource, preferentially applying a wiring line that requires rigid timing. In this method, the technique shortens the error correction time for the wiring crowding region, and prevents the timing from deteriorating due to the bypass routing.

However, the local wiring crowding region is enlarged because of increase of a total wiring line amount including wiring lines that require rigid timing due to the high integration and speeding up in the recent LSI. Accordingly, the routing prohibition region for reserving the routing resource generated in the method disclosed in JP2008-227198A is naturally enlarged. When the routing prohibition region is enlarged, an amount of the wiring lines bypassing the routing prohibition region also increases. As the result, the number of routing errors caused by the bypassing routing increases, and accordingly there will be problems that the routing error cannot be eliminated completely and still remains even when the rerouting is carried out after deleting the routing prohibition region for reserving the routing resource and that the correction time of the routing error increases.

SUMMARY

The present invention seeks to solve one or more of the above problems, or to improve upon those problems at least in part.

In one embodiment, a layout method of a semiconductor integrated circuit, includes: extracting a wiring crowding place where wiring lines are crowded as compared with a predetermined condition, after carrying out a routing in a region where a placement of circuit elements of the semiconductor integrated circuit is carried out; generating a plurality of routing prohibition regions where a routing is prohibited in an area including the wiring crowding place; carrying out a routing by bypassing the plurality of routing prohibition regions; deleting the plurality of routing prohibition regions after the carrying out routing step; and carrying out a rerouting after the deleting step. The generating step includes: calculating a size and an interval of the plurality of routing prohibition regions based on a rate for generating a routing prohibition region in the area in each wiring layer, and generating the plurality of routing prohibition regions in the area on the basis of the calculating result.

In another embodiment, a tangible computer-readable medium including a computer program for a layout method of a semiconductor integrated circuit, including code operable to control a computer, the code includes: extracting a wiring crowding place where wiring lines are crowded as compared with a predetermined condition, after carrying out a routing in a region where a placement of circuit elements of the semiconductor integrated circuit is carried out; generating a plurality of routing prohibition regions where a routing is prohibited in an area including the wiring crowding place; carrying out a routing by bypassing the plurality of routing prohibition regions; deleting the plurality of routing prohibition regions after the carrying out routing step; and carrying out a re-routing after the deleting step. The generating step includes: calculating a size and an interval of the plurality of routing prohibition regions based on a rate for generating a routing prohibition region in the area in each wiring layer, and generating the plurality of routing prohibition regions in the area on the basis of the calculating result.

In another embodiment, a layout device of a semiconductor integrated circuit, includes: a crowding extraction and determination portion configured to extract a wiring crowding place where wiring lines are crowded as compared with a predetermined condition, after carrying out a routing in a region where a placement of circuit elements of the semiconductor integrated circuit is carried out; a prohibition region generating portion configured to generate a plurality of routing prohibition regions where a routing is prohibited in an area including the wiring crowding place; a routing re-estimation portion configured to carry out a routing by bypassing the plurality of routing prohibition regions; a prohibition region deletion portion configured to delete the plurality of routing prohibition regions after the routing by bypassing is carried out; and a re-routing portion configured to carry out a re-routing after the plurality of routing prohibition regions is deleted. The prohibition region generating portion includes: a prohibition region calculating portion configured to calculate a size and an interval of the plurality of routing prohibition regions based on a rate for generating a routing prohibition region in the area in each wiring layer, and a prohibition region generating portion configured to generate the plurality of routing prohibition regions in the area on the basis of the calculating result.

According to the present invention, even in the case of a highly-integrated semiconductor integrated circuit, a time for routing in a layout design can be shortened.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a functional block diagram showing a configuration of the layout device of the semiconductor integrated circuit according to the embodiment of the present invention;

FIG. 7B is a flowchart showing the procedure (step S4) to create the information used for generating the routing prohibition region in the flowchart of FIG. 3A;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to the attached drawings, an embodiment of a layout device and a layout method of a semiconductor integrated circuit of the present invention will be described below.

Figure 1:
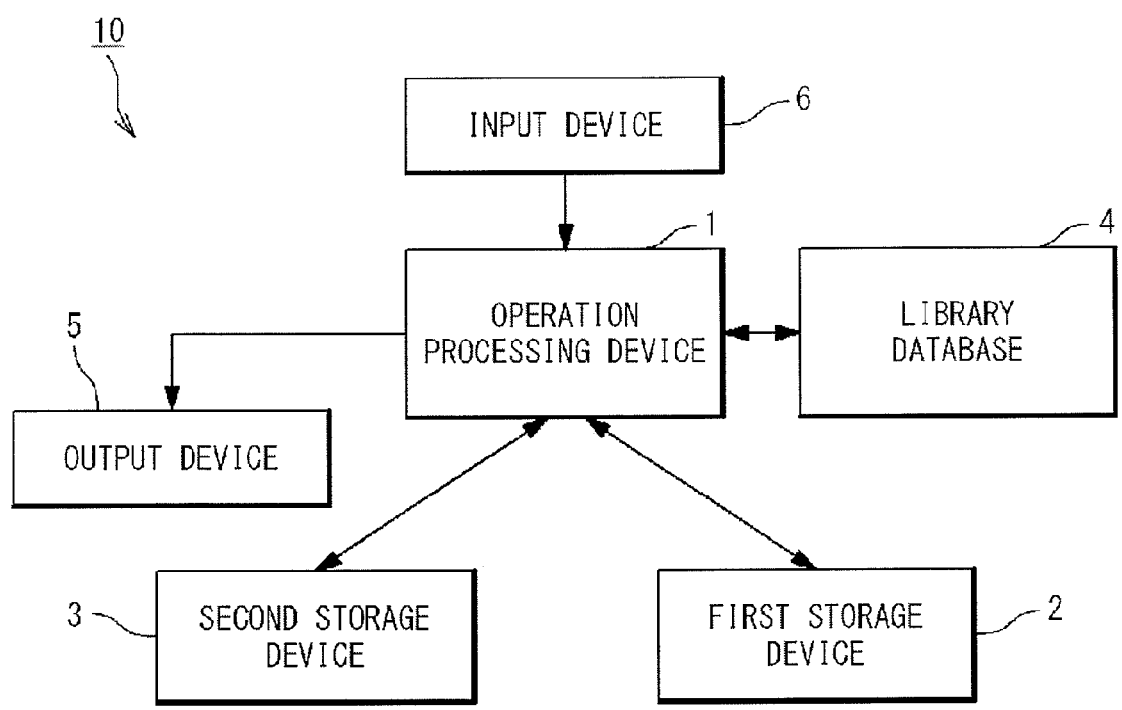
FIG. 1 is a block diagram showing a configuration of a layout device of a semiconductor integrated circuit according to an embodiment of the present invention.

A configuration of the layout device of the semiconductor integrated circuit according to the embodiment of the present invention will be described. FIG. 1 is a block diagram showing the configuration of the layout device of the semiconductor integrated circuit according to the embodiment of the present invention. The layout device 10 is an information processing device exemplified by a computer, and includes an operation processing device 1, a first storage device 2, a second storage device 3, a library database 4, an output device 5, and an input device 6. These are connected so as to be able to send and receive information with each other through a bus and a cable.

The first storage device 2 stores layout data such as LSI logical design data, LSI physical design data, STA (Static Timing Analysis) restriction data, a routing prohibition region information list, and the like. The second storage device 3 stores a layout program describing a layout method such as a logical circuit placement process procedure, an outline routing process procedure, a routing prohibition region generation procedure, a detail routing process procedure, and the like. The library database 4 stores: a timing library; and a library including a logical circuit diagram net wiring information, a chip shape and the like. The first storage device 2, the second storage device 3, and the library database 4 are exemplified by an electronic device such as a ROM (Read Only Memory), a RAM (Random Access Memory), a flash memory, a HDD (Hard Disk Drive) and the like, or by a combination of them. Meanwhile, a device for reading information (the above-mentioned data and program), which is recorded in a computer readable storage medium, that is, an optical disk such as a CD-ROM and a DVD, a magnetic disk, a magnetic tape, a semiconductor memory and others, from the storage medium may be employed.

The operation processing device 1 carries out the process of the layout program stored in the second storage device 3 by using data stored in the first storage device 2 and the library data base 4. The operation processing device 1 is exemplified by a CPU (Central Processing Unit) and the peripheral circuit (for example, a RAM (Random Access Memory) as a main memory).

The output device 5 outputs data of: an outline routing diagram; a detail routing diagram; and the like created by the operation processing device 1. The output device is exemplified by a display and a printer.

The input device 6 outputs data generated by a user's operation to the operation processing device 1 and the like. The input device is exemplified by a keyboard and a mouse.

FIG. 2 is a functional block diagram showing a function of the layout device of the semiconductor integrated circuit according to the embodiment of the present invention. The layout device 10 includes an outline routing portion 11, a wiring crowding degree extraction portion 12, a wiring crowding degree determination portion 13, an input information creating portion 14, a routing prohibition region information generation portion 15, a routing prohibition region information processing portion 16, an outline routing re-estimation portion 17, a routing prohibition region deletion portion 18, a detail routing portion 19, a routing error determination portion 20, a routing prohibition region condition changing portion 21, and an input information determination portion 22. The above-mentioned layout programs are installed in the above-described information processing device exemplified by the computer, and thus functions of the outline routing portion 11 to the input information determination portion 22 are realized.

The outline routing portion 11 carries out an outline routing after an automatic placement of logical circuits (cells, modules, macros and the like) is carried out based on a commonly-known method. The wiring crowding degree extraction portion 12 extracts a wiring crowding degree in each partial region from a result of the outline routing by the outline routing portion 11. The wiring crowding degree determination portion 13 determines whether a partial region with a high wiring crowding degree exists or not based on the wiring crowding degrees extracted by the wiring crowding degree extraction portion 12. The outline routing portion 11, the wiring crowding degree extraction portion 12, and the wiring crowding degree determination portion 13 can be regarded as a crowding extraction and determination portion 25 which extracts a wiring crowding region where wiring lines are crowded more than a preliminarily set condition after the placement of the circuit elements and routing of the semiconductor integrated circuit.

The input information creating portion 14 creates input information F01 used for generating a routing prohibition region regarding the region determined as the region with high wiring crowding degree. The routing prohibition region information generation portion 15 creates routing prohibition region generating information F02 used for reserving a routing resource by using the input information F01 created by the input information creating portion 14 as an input. The routing prohibition region information processing portion 16 generates the routing prohibition region by using the routing prohibition region generating information F02 generated by the routing prohibition region information generation portion 15 as an input. The input information creating portion 14, the routing prohibition region information generation portion 15, and the routing prohibition region information processing portion 16 can be regarded as a prohibition region generating portion 26 for generating a plurality of routing prohibition region where a routing is prohibited in the region including the wiring crowding region.

The outline routing re-estimation portion 17 carries out re-estimation of the outline routing (path), considering the routing prohibition region generated by the routing prohibition region information processing portion 16. The routing prohibition region deletion portion 18 deletes the routing prohibition region generated by the routing prohibition region information processing portion 16. In the case where the wiring crowding degree is determined to be low by the wiring crowding degree determination portion 13, the detail routing portion 19 carries out the detail routing. The routing error determination portion 20 determines whether the routing error is eliminated and the routing is completed or not after the detail routing portion 19 carries out the detail routing process. In the case where the routing error determination portion 20 determines that the routing error remains and the routing is not completed, the routing prohibition region condition changing portion 21 changes a condition to generate a routing prohibition region in order to increase a routing resource in each one region. The input information determination portion 22 determines whether or not the condition to generate the routing prohibition region changed by the routing prohibition region condition changing portion 21 satisfies the input information F01. Specific functions and operations will be described below.

Figure 3A:
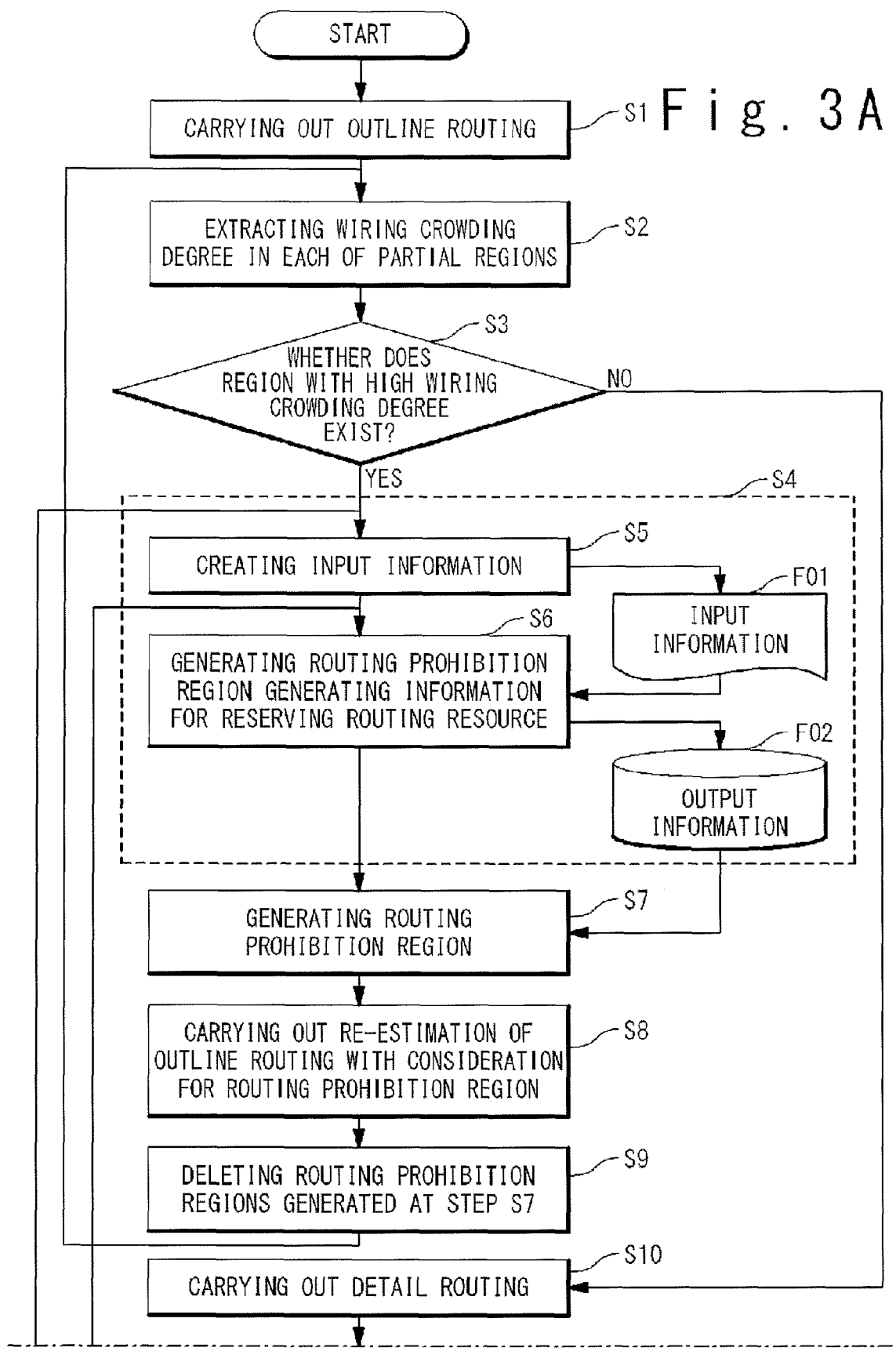
FIG. 3A is a flowchart showing an example of an operation of the layout device of the semiconductor integrated circuit according to the embodiment of the present invention.
Figure 3B:
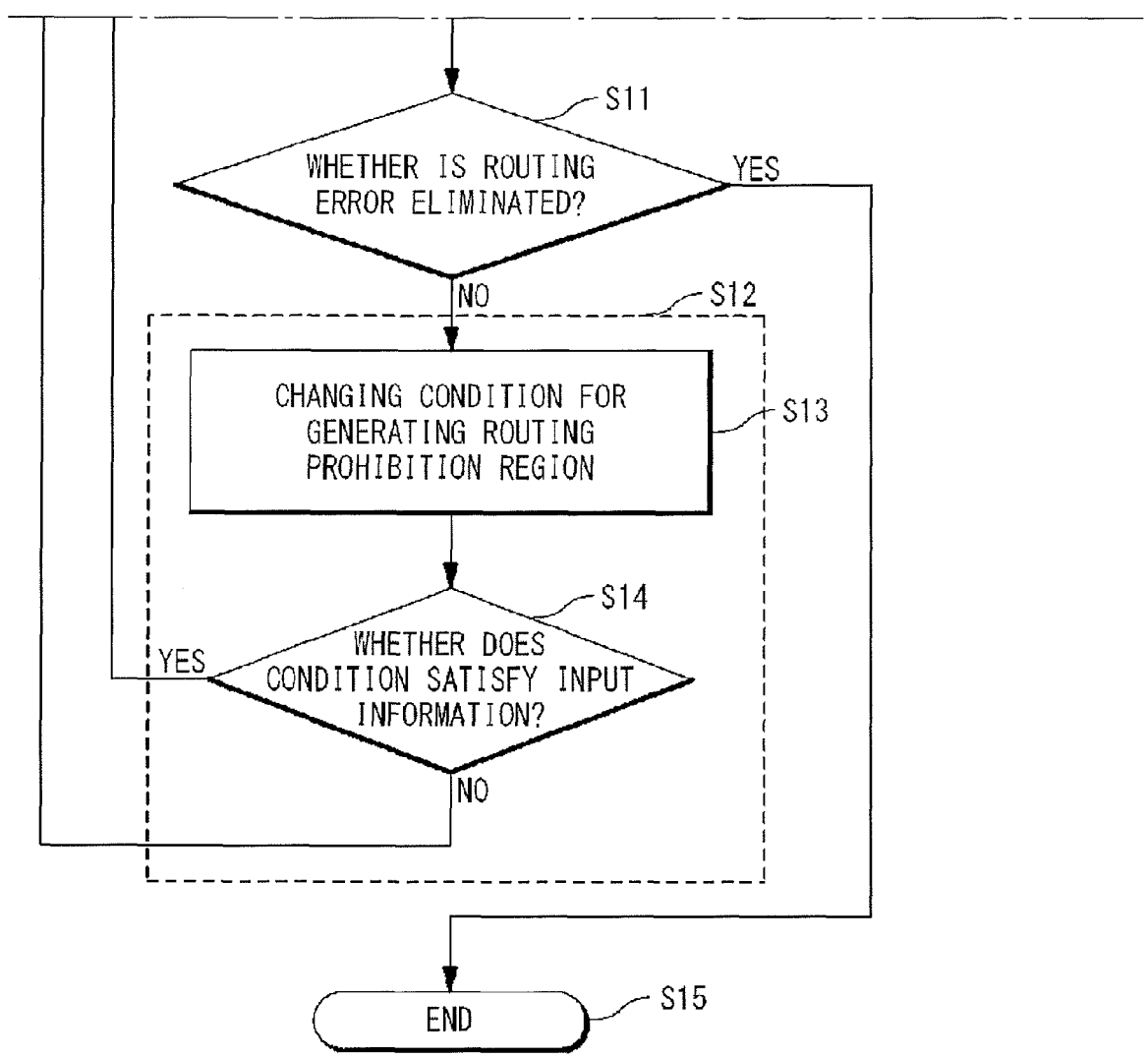
FIG. 3B is a flowchart showing an example of an operation of the layout device of the semiconductor integrated circuit according to the embodiment of the present invention.
Figure 4:
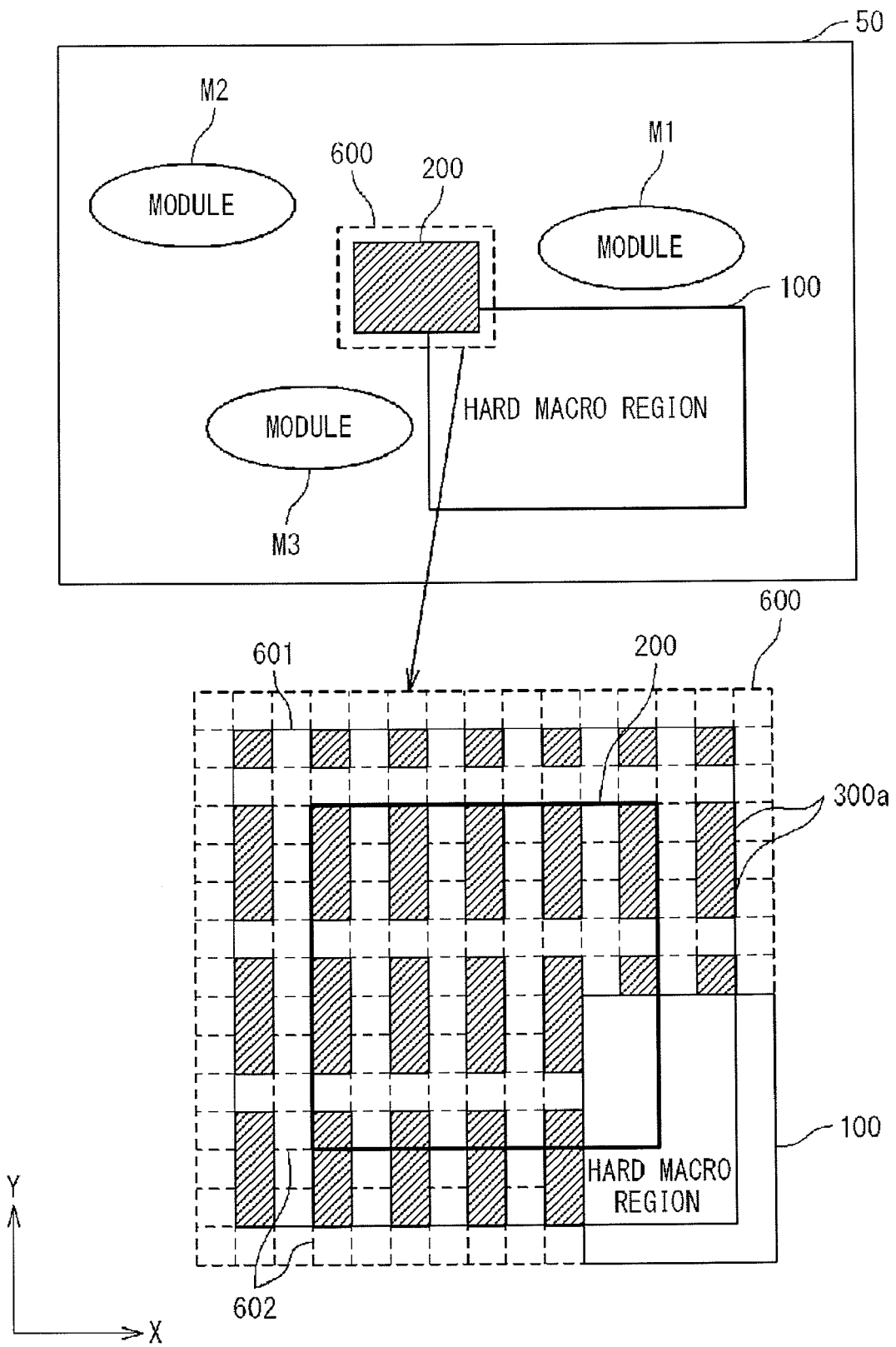
FIG. 4 is a schematic diagram showing an arrangement of a routing prohibition region generated in the layout method of FIGS. 3A and 3B.
Figure 5:
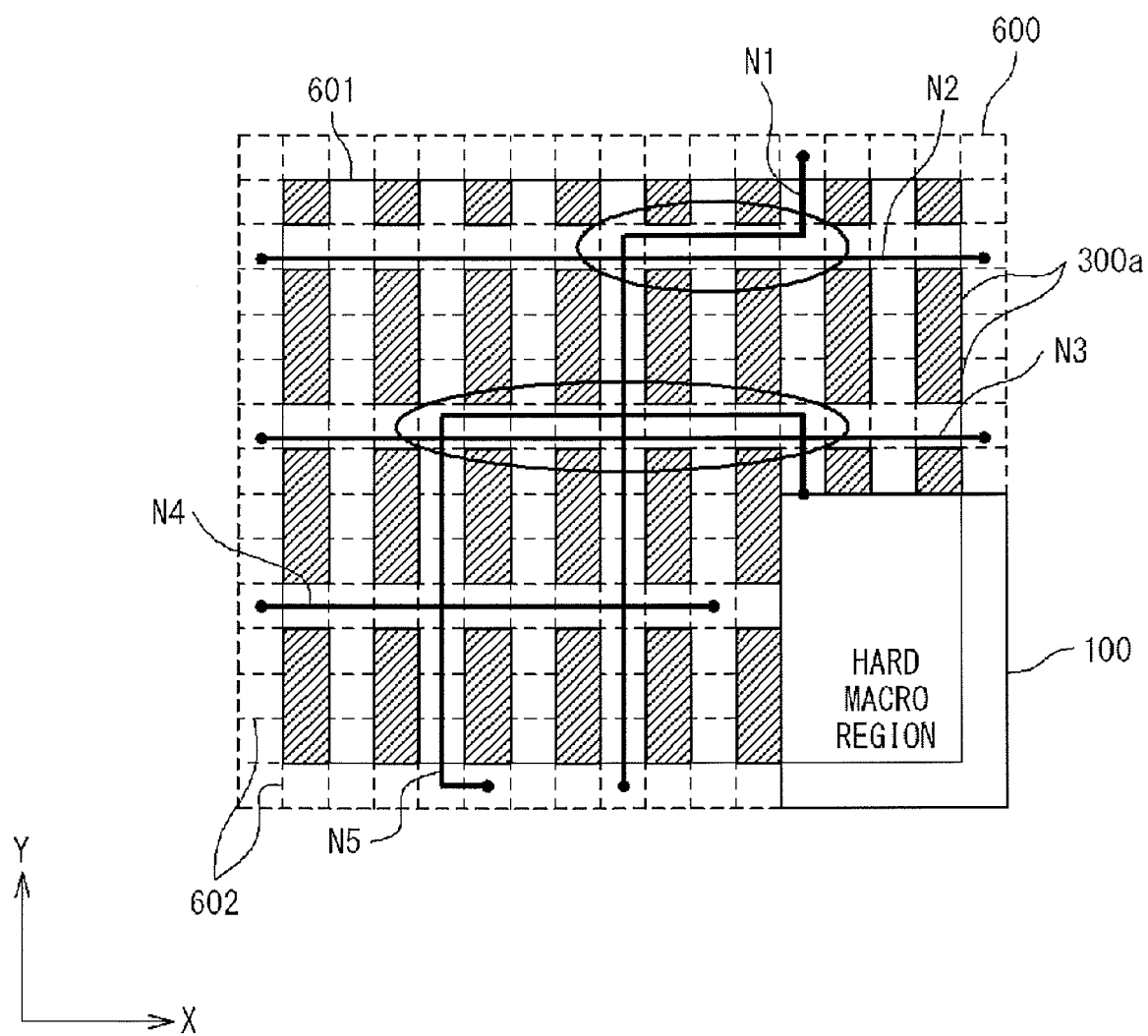
FIG. 5 is a schematic diagram showing an arranging process of routing in the layout method of FIGS. 3A and 3B.
Figure 6:
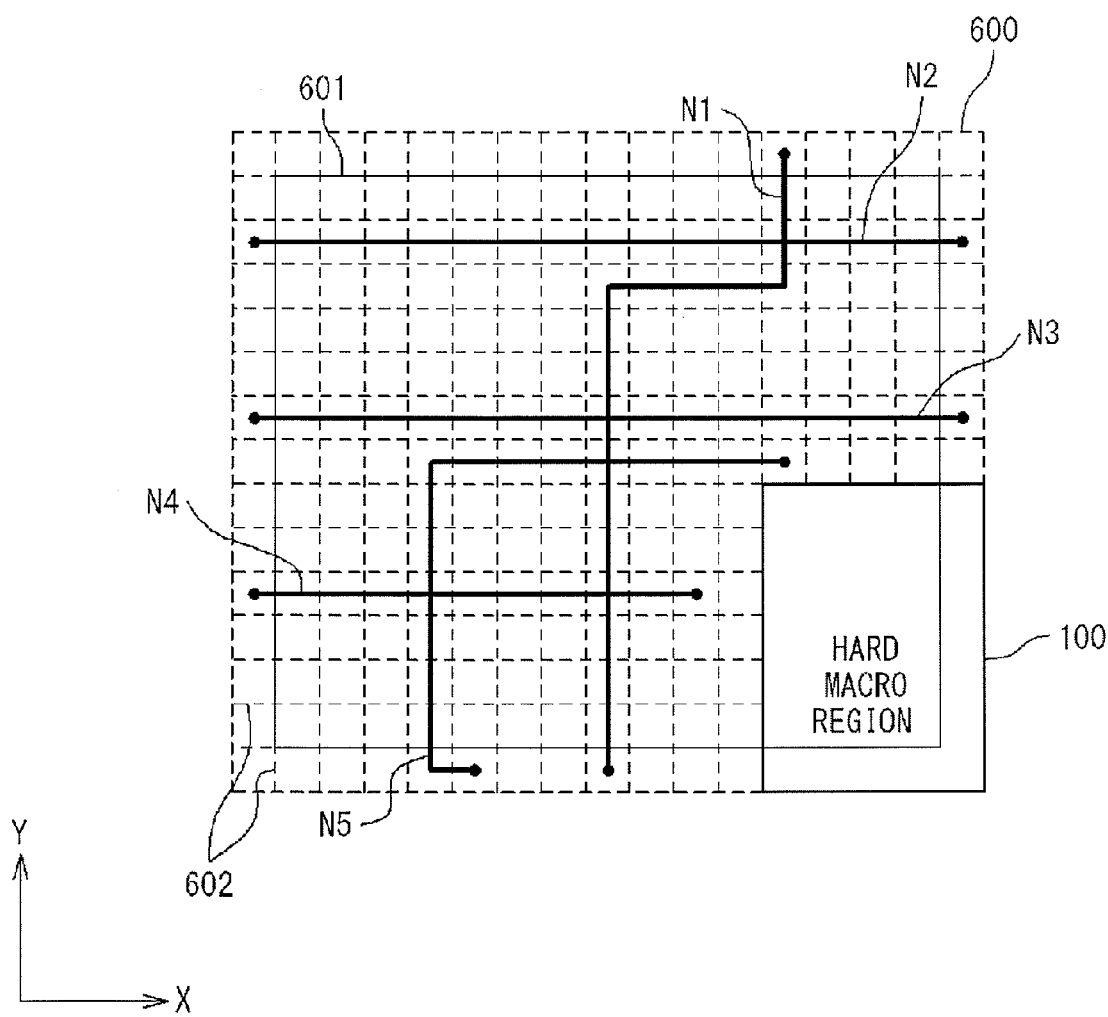
FIG. 6 is a schematic diagram showing the arranging process of routing in the layout method of FIGS. 3A and 3B.

Next, an operation (a layout method) of the layout device of the semiconductor integrated circuit according to the embodiment of the present invention will be described below. FIGS. 3A and 3B are flowcharts showing one example of the operation (the layout method) of the layout device of the semiconductor integrated circuit according to the embodiment of the present invention. FIGS. 4 to 6 are schematic diagrams showing one example of: arrangement of the generated routing prohibition region; and an arranging process of the routing in the layout method of FIGS. 3A and 3B. In FIGS. 4, 5 and 6, the semiconductor integrated circuit 50 includes a hard macro region (RAM, ROM and the like) 100 and functional modules M1 to M3. There is a wiring crowding region 200, a region where wiring lines are crowded, at a corner of and in the vicinity of the hard macro region 100. An area 600 made by expanding a periphery of the wiring crowding region 200 to its outside includes an area 601, a lattice 602, routing prohibition regions 300a, and wiring lines N1 to N5. The area 601 includes the wiring crowding region 200, and is an area where the routing prohibition region is generated in the present embodiment. The lattice 602 is a lattice indicating the minimum routing unit (one grid) of a single routing track for a wiring line of a wiring layer that is an object of the routing prohibition. The routing prohibition region 300a is a region where the routing is prohibited. Meanwhile, in FIGS. 4 to 6, a wiring line in a vertical direction of the drawings is a wiring line in a Y direction, and a wiring line in a horizontal direction of the drawings is a wiring line in an X direction.

Using the examples of FIGS. 4 to 6, the flowcharts of FIGS. 3A and 3B will be described. However, the respective steps described below are processes carried out in cooperation between: the layout program in the second storage device 3; and the operation processing device 1 in the computer system shown in FIG. 1. As for the data to be inputted and the data to be outputted at the respective steps, the input and output are carried out by the first storage medium 2, the library database 4, the input device 6, and the output device 5.

(1) Step S1:

At first, based on a commonly-known method, an automatic placement process of logical circuits (cells, modules, macros and the like) is carried out. The outline routing portion 11 carries out outline routing after the completion of the automatic placement process. The outline routing is a process described below. Specifically, the inside of a routing region is roughly separated into a plurality of segments at first. Then, each of the plurality of segments is separated into a plurality of partial regions called an outline lattice. After that, in order to check which partial region each of all nets pass through, the outline paths are obtained, admitting routing errors to some extent. The outline routing portion 11 generates a routing report. The routing report describes: a routing error occurrence coordinate and a wiring layer where an error occurs; or the number of routing errors and an error occurrence rate in each of the wiring layers in the whole of the routing region.

(2) Step S2:

The wiring crowding degree extraction portion 12 extracts the wiring crowding degree in each of the partial regions from the result of the outline routing at step S1. For example, the partial region may be the outline lattice, and may be a region including a plurality of the outline lattices. In addition, the partial region may be a region that the outline lattice is minutely separated. When the outline lattice is minutely separated, focusing of the wiring crowding region can be easily realized; however, an extraction time will be increased. The wiring crowding degree is a ratio of the number of the wired wiring lines to the number of the routing tracks included in the routing region. For example, in each of the wiring layers in the partial region, the wiring crowding degree can be extracted by dividing the number of the presently-wired wiring lines by the number of the routing tracks (the possible number of the wiring lines to be wired).

(3) Step S3:

The wiring crowding degree determination portion 13 determines whether the region with high wiring crowding degree exists or not based on the wiring crowding degrees extracted at step S2. For example, as determination criteria, in the case where the wiring crowding degree exceeds 100%, the region is determined to be the region with high wiring crowding degree since the number of wiring lines is larger than the possible number of the wiring lines to be wired. However, if it can be determined that the routing is difficult because of dependency on a process and a design even though the degree falls below 100%, it may be appropriately determined whether or not the region is the region with high wiring crowding degree, with consideration for the dependency.

In the case where the region is determined to be the region with low wiring crowding degree (step S3: No), the flow proceeds to step S10, and the detail routing is carried out. In the case where the region is determined to be the region with high wiring crowding degree (step S3: Yes), the flow proceeds to step S4, and the information for generating the routing prohibition region is generated.

(4) Step S4:

To the region determined as the region with the high wiring crowding degree at step S3, the routing prohibition region information generation portion 15 (and the input information creating portion 14) generates the routing prohibition region generating information F02 used for generating the routing prohibition region. The process of step S4 (steps S5 to S6) will be described below.

(5) Step S5:

To the region determined as the region with the high wiring crowding degree, the input information creating portion 14 creates the input information F01 used for generating the routing prohibition region.

(6) Step S6:

The routing prohibition region information generation portion 15 generates the routing prohibition region generating information F02 for reserving the routing resource by using the input information F01 as an input. The routing prohibition region generating information F02 is information indicating how to generate a plurality of routing prohibition regions (a predetermined condition for generating the routing prohibition region) to the region determined as the region with the high wiring crowding degree, and designating a size of the routing prohibition region and an arrangement place of the routing prohibition region.

(7) Step S7:

The routing prohibition region information processing portion 16 generates the routing prohibition region by using the routing prohibition region generating information F02 created at step S4 (step S5+step S6) as an input.

FIG. 4 shows an example of generating the routing prohibition region. In FIG. 4, there is the routing crowding region 200 that is the region with the high wiring crowding degree at the corner of and in the vicinity of the hard macro region 100. The area 600 includes the wiring crowding region 200, and is made by expanding the periphery of the wiring crowding region 200 to its outside. In the area 600, the routing prohibition region information processing portion 16 generates the routing prohibition regions 300a in the area 601, which is prepared for generating routing prohibition regions, by using the routing prohibition region generating information F02 created at step S4 as an input.

(8) Step S8:

The outline routing re-estimation portion 17 carries out the re-estimation of the outline routing (path), with consideration for the routing prohibition region 300a generated at step S7.

FIG. 5 shows a state after the re-estimation of the outline routing is carried out in the area 600. The region between the routing prohibition regions 300a is used as the routing region. A wiring line that cannot be applied within the area 601 where the routing prohibition, regions 300a are generated is wired outside the area 601. However, in the process of the outline routing, since the timing is considered, the routing is carried out while the routing error remains even when there is a place where the routing track runs short. Each place rounded by an ellipse in FIG. 5 shows a routing error place. In one routing error place, two wiring lines of the wiring line N1 and the wiring line N2 are wired in one routing track, which shows a state where the routing error still remains. Similarly, in the other routing error place, two wiring lines of the wiring line N3 and the wiring line N5 are wired in one routing track, which shows a state where the routing error still remains.

(9) Step S9:

The routing prohibition region deletion portion 18 deletes the routing prohibition regions 300a generated at step S7. Then, the flow returns to step S2 again, and the extraction of the wiring crowding degree is carried out. A series of the processes at steps S2 to S9 are repeated until the region with the high wiring crowding degree disappears.

(10) Step S10:

In the case where the region is determined as the region with the low wiring crowding degree at step S3, the detail routing portion 19 carries out the detail routing. The detail routing is a process for: further minutely segmenting the outline lattice into lattices, each lattice being composed of a single grid (single grid lattice); obtaining the detail path of each of all nets o the basis of which single grid lattice the net passes through; and correcting the wiring line that violates the design rule.

FIG. 6 shows a state after the detail routing is carried out in the area 600. In FIG. 6, the routing prohibition regions 300a have been deleted at step S9, and thus can be used as the routing region. The routing errors between the wiring line N1 and the wiring line N2 and between the wiring line N3 and the wiring line N5 that has occurred by routing in the same wiring layer of the same grid in FIG. 5 can be restored by moving the wiring line N1 and the wiring line N5 to the routing region generated in FIG. 6 when the routing prohibition region 300a has been deleted. In addition, since the routing region that can be used by deleting the routing prohibition region 300a is reserved in the vicinity of the routing error occurrence places, the routing error can be corrected without generating the bypassing of the wiring line.

(11) Step S11:

After the process of the detail routing at step S10 is carried out, the routing error determination portion 20 determines whether or not the routing error is eliminated and whether or not the routing error is restored. In the case where it is determined that the routing error is restored (step S11: Yes), the flow proceeds to step S15, and thus the routing process is completed. In the case where it is determined that the routing error still remains and that the routing error is not restored (step S11: No), the flow proceeds to step S12, and thus a condition of generating the routing prohibition region is changed.

However, in the case where the routing error still remains, when it can be determined that the number of the routing errors is a predetermined number (for example, a few places) or less and can be restored by a simple correction without the automatic routing tool, the error may be determined to be restored, the flow may proceed to step S15 to complete the routing.

(12) Step S12:

In the case where it is determined that the routing error has not been restored at step S11, it can be determined that the routing resource reserved by the routing prohibition region 300a generated in the series of processes of steps S2 to S9 is not the most suitable. Accordingly, the routing prohibition region condition changing portion 21 (and the input information determination portion 22) changes a condition of generating the routing prohibition region at step S12. Then, the flow returns to step S4 (S5+S6) and the routing prohibition region generating information F02 is created again. After that, until the routing error disappears in the determination at step S11, the flow returns from step S12 to step S4 and then the flow carrying out step S4 to step S11 is repeated. The process at step S12 (steps S13 to S14) will be described below.

(13) Step S13:

In the case where the routing error is not restored at step S11, the routing prohibition region condition changing portion 21 changes the condition for generating the routing prohibition region in order to increase the routing resource at each one place.

(14) Step S14:

The input information determination portion 22 determines whether or not the condition for generating the routing prohibition region that was changed at step S13 satisfies the input information F01 outputted at step S5. In the case where the changed condition for generating the routing prohibition region does not satisfy the input information F01 (step S14: No), the flow returns to step S5 and then the input information F01 is created again. In the case where the changed condition for generating the routing prohibition region satisfies the input information F01 (step S14: Yes), the flow returns to step S6 and then the routing prohibition region generating information F02 is created again.

Figure 7A:
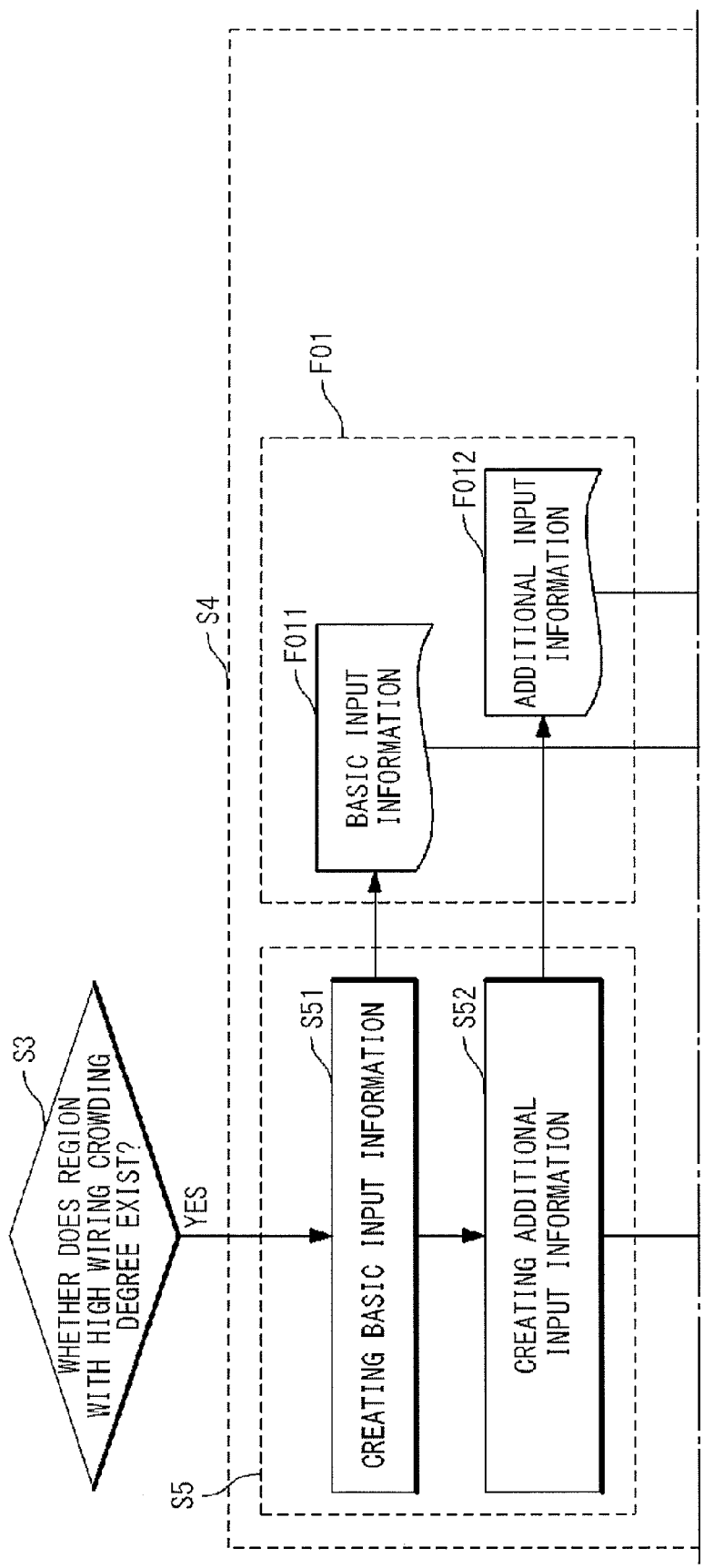
FIG. 7A is a flowchart showing a procedure (step S4) to create information used for generating the routing prohibition region in the flowchart of FIG. 3A.
Figure 8:
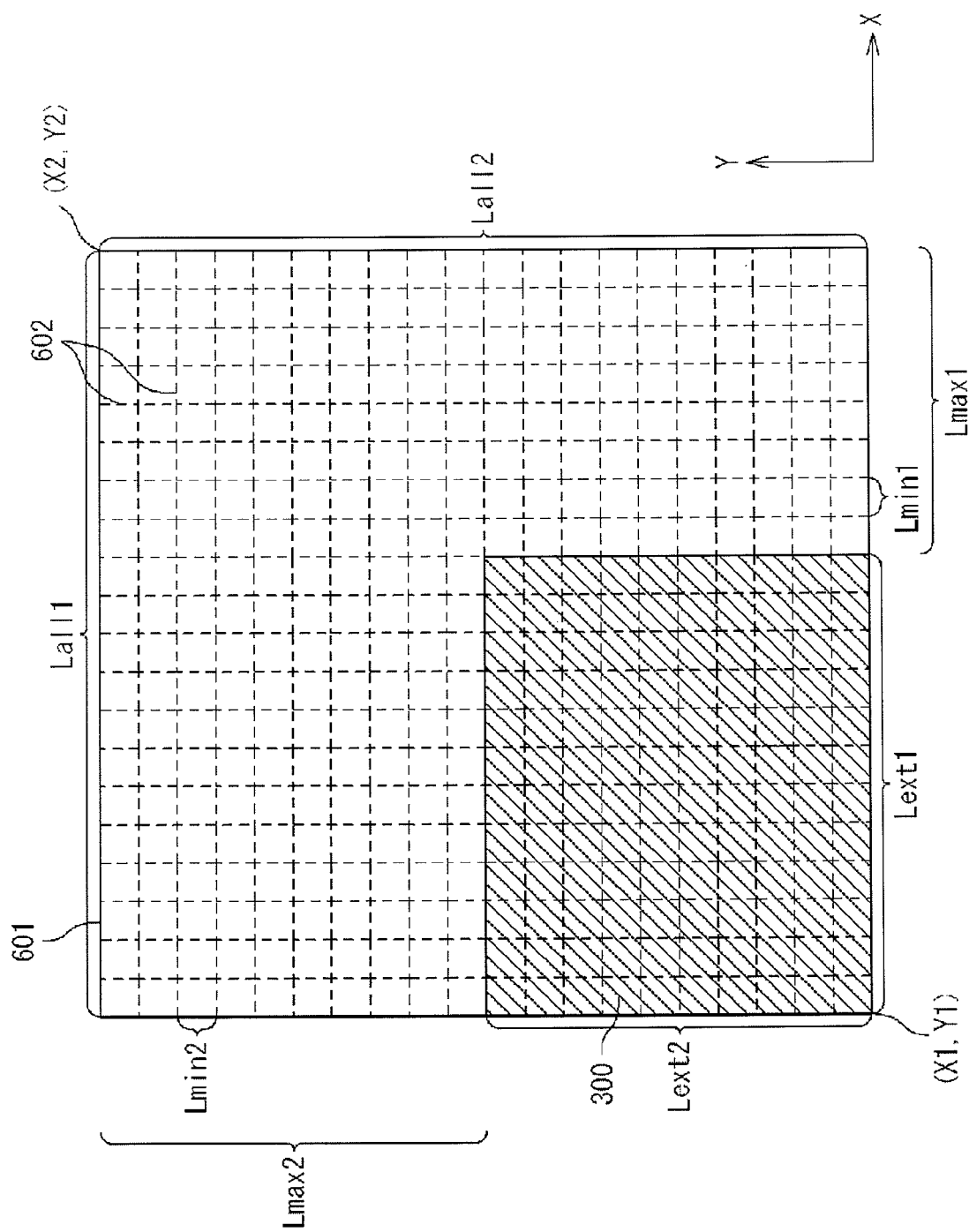
FIG. 8 is a schematic diagram describing one example of a generation process of the routing prohibition region at step S4 of FIG. 3A.
Figure 9:
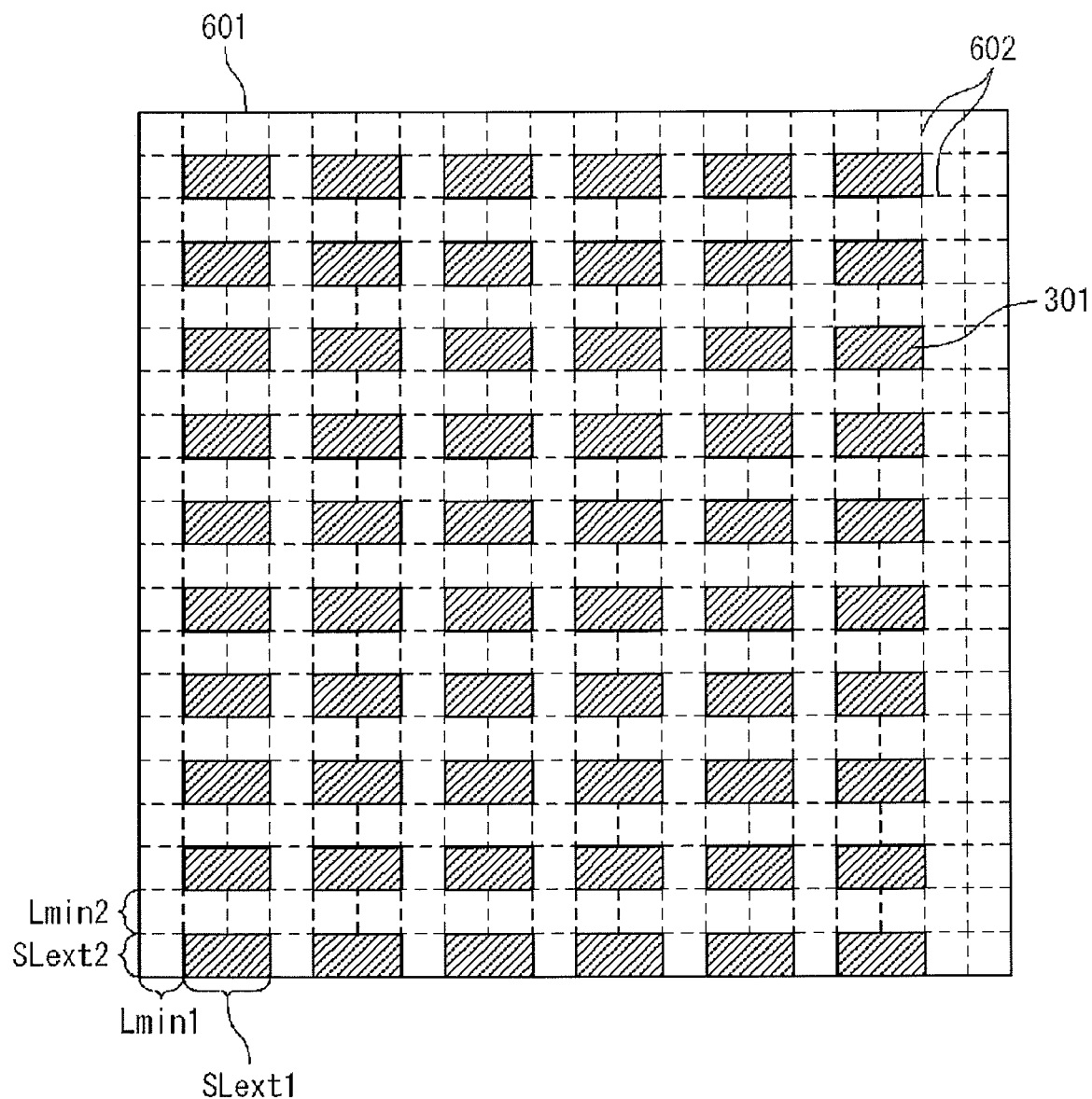
FIG. 9 is a schematic diagram describing one example of the generation process of the routing prohibition region at step S4 of FIG. 3A.

Next, details of the process at step S4 in the flowchart according to the present embodiment of FIG. 3A will be described. FIGS. 7A and 7B are flowcharts showing the procedure (step S4) to create the information for generating the routing prohibition region in the flowchart of FIG. 3A. FIGS. 8 to 12 are schematic diagrams describing one example of the generation process of the routing prohibit ion region at step S4 of FIG. 3A. FIGS. 8 to 12 show the area 601 where the routing prohibition region in FIGS. 4 to 6. However, FIGS. 8 and 9 are also views describing examples of respective variables. In this case, FIG. 8 shows variables of a calculation initial step, and FIG. 9 shows: variables outputted as a calculation result; and an example of the generation of the routing prohibition region.

(5) Step S5:

At first, the input information creating portion 14 creates the input information F01 used for generating the routing prohibition region. The input information creating process is separated into two processes of: determination of basic input information F011 (step S51); and determination of additional input information F012 (step S52). Step S51 and step S52 will be described below.

(51) Step S51:

The input information creating portion 14 creates the basic input information F011 and outputs the information F011. The basic input information F011 shows: information (a) of an area where the routing prohibition is generated; information (b) of the wiring layer that is an object of the routing prohibition; and information (c) of a generation rate (%) at which the routing prohibition is generated. The information (a) to (c) is determined on the basis of: the routing report in the outline routing at step S1; the wiring crowding degree in each partial region extracted at step S2; and the like. Specific description is as follows.

The information (a) of the area where the routing prohibition is generated specifies bottom-left and top-right coordinates, for example, so as to include an area whose wiring crowding degree in each partial region extracted at step S2 exceeds 100%. Moreover, in the case where the regions exceeding 100% are continuously generated in the X direction and in the Y direction, the regions continuously exceeding 100% are regarded as one group. Then, the minimum value and maximum value of the X coordinate and the minimum value and maximum value of the Y coordinate among a coordinate group of the one group are obtained. After that, the area including: the bottom-left coordinate (the X coordinate minimum value and the Y coordinate minimum value); and the top-right coordinate (the X coordinate maximum value and the Y coordinate maximum value) is specified.

The information (b) of the wiring layer that is an object of the routing prohibition can be generated by extracting a routing error layer, for example, in the routing error occurrence coordinate on the basis of the routing report generated at step S1.

The information (c) of the generation rate (%) of the routing prohibition region is a value indicating the required extent of the routing prohibition region (corresponding to an amount of the routing resource) in reserving the routing resource by deleting the routing prohibition region at step S9. That is, the information (c) is a ratio of the routing prohibition region 300a generated in the area 601 based on the wiring crowding degree. For example, in the region with the high wiring crowding degree determined at step S3, the value can be obtained on the basis of a ratio of the number of wiring lines with the routing errors (for example, "the number of wiring lines with the routing errors"/"the number of actually-wired wiring lines"), when the routing is carried out in the region, in which the number of wiring lines is larger than the number of the routing tracks in the routing report at step S1.

(52) Step S52:

The input information creating portion 14 creates the additional input information F012 and outputs the information F012. The additional input information F012 shows: information (d) of the minimum number of wiring lines able to pass through between the adjacent routing prohibition regions in the wiring layer that is an object of the routing prohibition within an area where the routing prohibition is generated; information (e) of the minimum number of wiring lines able to pass through between the adjacent routing prohibition regions in a different routing direction from a routing direction of the wiring layer that is an object of the routing prohibition; and information (f) of a generation rate (%) at which the routing prohibition is generated in the same direction as that of the case of the information (e). For example, if the wiring layer that is an object of the routing prohibition is in the Y direction, the information (d) is information of the number of wiring lines in the Y direction, the information (e) is information of the number of wiring lines in the X direction, and the information (f) is information of the routing prohibition region with respect to the wiring line in the X direction. On this occasion, the information of the routing prohibition region with respect to the wiring line in the Y direction is the information (c). The information (d) to (f) is determined on the basis of: the routing report in the outline routing at step S1; the wiring crowding degree in each partial region extracted at step S2; and the like. Specific description is as follows.

The information (d) of the minimum number of wiring lines able to pass through between the adjacent routing prohibition regions may specify the minimum unit "1"; or the information may be determined on the basis of the way how the wiring line passes in the routing error occurrence region interfered by the area (a) where the routing prohibition region is generated. FIGS. 9 to 12 show the generation state of the routing prohibition region which differs on the basis of the minimum number of the wiring lines. For example, in the case where the routing prohibition region is generated between the modules connected to each other with ten wiring lines that have rigid timing and that are required to be wired in the shortest path, the information is set to the minimum number (d) of the wiring lines in which the routing prohibition regions are gathered as shown in FIG. 12 enabling to reserve the routing resources for ten wiring lines after the routing prohibition regions are deleted. Additionally, in the case where the routing prohibition region is generated in an region where the wiring lines pass through in various directions, the information is set to the minimum number (d) of the wiring lines in which the routing prohibition regions are scattered as shown in FIG. 9 enabling to sparsely reserve the routing resources after the routing prohibition regions are deleted.

Moreover, in the case of a different routing direction from the routing direction of the wiring layer, the information (e) of the minimum number of the wiring lines able to pass through between the adjacent routing prohibition regions may also specify the minimum unit "1" in the same reason as that of (d); or the information may be determined on the basis of the way how the wiring line passes in the routing error occurrence region interfered by the area (a) where the routing prohibition region is generated.

For example, in the same reason as that of (c), the information (f) of the generation rate at which the routing prohibition is generated can be obtained on the basis of a ratio of the number of wiring lines with the routing errors (for example, "the number of wiring lines with the routing errors"/"the number of actually-wired wiring lines"), when the routing is carried out in the region, in which the number of wiring lines is larger than the number of the routing tracks in the routing report at step S1.

Here, a reason for considering both of the X direction and Y direction is as follows. Even if the wiring layer of the routing prohibition object is in the Y direction, the rule is not always kept when the routing is carried out in the region of the high wiring crowding degree. If an error regarding the DRC (Design Rule Checking), the LVS (Layout Versus Schematics) and the like does not occur, one of the vertical direction and horizontal direction in the identical layer is switched to the other in some cases. For this reason, the reservation of resources in both of the X direction and Y direction can be considered.

In addition, the basic input information F011 is essential input information, but the additional input information F012 is not essential input information. In the case where an index for designating the extent of a size and interval of the routing prohibition region to be generated are already given by the designer, a carrying-out time can be shortened by setting the additional input information F012. In the case where the additional input information F012 is not specified, the size and interval of the routing prohibition region are set as the minimum values, and thus the change values in the condition changing process (step S12) of generating the routing prohibition region in the flow of FIG. 3B are the minimum values. Accordingly, a repetition count of the flow may be increased. However, in the case where the additional input information F012 is specified, starting values of the size and interval of generating the routing prohibition region start from the middle. Accordingly, since the number of conditions in the condition changing process of the routing prohibition region is reduced, the repetition count can be reduced.

(6) Step S6:

The routing prohibition region information generation portion 15 generates the routing prohibition region generating information F02 for reserving the routing resource by using the basic input information F011 and the additional input information F012 as inputs. The routing prohibition region generating information generation process at step S6 is carried out in the process at steps S61 to S611. Steps S61 to S611 will be described below.

(6-1) Step S61:

The total number La111 of all routing tracks allowing the routing in the wiring direction of the wiring layer (the wiring layer that is an object of the routing prohibition) specified by the information (b) is calculated in the whole of the region specified by the coordinates of the information (a) of the basic input information F011 (the area where the routing prohibition is generated).

Using FIG. 8, a calculation procedure of the total number La111 of routing tracks is shown. The information (a) of the area where the routing prohibition is generated sets the bottom-left coordinate (X1, Y1) of the area 601 and the top-right coordinate (X2, Y2) of the area 601. The information (b) of the wiring layer that is an object of the routing prohibition sets a wiring layer as a second layer and as a wiring layer where the routing in the Y direction is carried out. A length in the X direction is obtained from the bottom-left coordinate (X1, Y1) and top-right coordinate (X2, Y2) of the range 601. When a grid size of one routing track in the wiring layer of the Y routing that is an object of the routing prohibition is assumed to be Z, the total number La111 of the routing tracks is calculated by Equation (1).

$$La111=(X2-X1)/Z: \quad \text{Equation (1)}$$

FIG. 8 shows that twenty routing tracks, each extending toward the Y direction, are included.

(6-2) Step S62

In the region specified by the coordinates of the information (a) of the basic input information F011 (the area where the routing prohibition is generated), the routing prohibition region is generated at a generation rate (the generation rate at which the routing prohibition is generated) specified by the information (c) toward the routing direction of the wiring layer (the wiring layer that is an object of the routing prohibition) specified by the information (b), and the maximum number Lmax1 of the wiring lines able to be wired in the routing direction of the wiring layer (the wiring layer that is an object of the routing prohibition) specified by the information (b) in the region where the routing prohibition region is not generated is calculated.

Using FIG. 8, a calculation procedure of the number Lmax1 of the wiring lines is shown. The information (c) of the generation rate (%) at which the routing prohibition is generated is assumed to be the generation rate Psnt1 of 60% (the generation rate Psnt1=60%), and thus the 60% of the routing in the Y direction is prohibited. The length of the area 601 in the X direction is assumed to be 1 (=100%), and the value of the generation rate Psnt1=60(%) at which the routing prohibition region 300 is generated is subtracted from 1. When this value is multiplied by the actual length of the area 601 in the X direction, the remaining length obtained by subtracting the actual length of the generated routing prohibition region 300 from the actual length of the area 601 in the X direction is obtained. On this occasion, a grid size (e.g., a width) of one routing track in the wiring layer of the Y routing is Z, and accordingly the number Lmax1 of the wiring lines is calculated by Equation (2).

$$L\text{max}1=(X2-X1)\times(1-\text{Psnt}1/100)/Z: \quad \text{Equation (2)}$$

FIG. 8 shows that the total number Lmax1 of the routing tracks is "20×(1−0.6)=8", that is, eight wiring lines can be wired to twenty routing tracks in the Y direction (the routing in the remaining twelve routing tracks is prohibited).

(6-3) Step S63:

Using the information (d) of the additional input information F012, the possible division number for insertion of the routing prohibition region is calculated with respect to the maximum number of the wiring lines (Lmax1) that can be wired in the Y direction, the maximum number being calculated at step S62.

As shown at step S61, since the routing direction is the Y direction, the information (d) is the minimum number Lmin1 of the wiring lines to be wired in the Y direction between the adjacent routing prohibition regions. The possible division number Lmax1B for insertion of the routing prohibition region is calculated by dividing the maximum number Lmax1 of the wiring lines that can be wired in the Y direction by the minimum number Lmin1 of the wiring lines to be wired in the Y direction between the adjacent routing prohibition regions. The calculation Equation is shown as the following Equation (3).

$$L\text{max}1B=L\text{max}1/L\text{min}1: \quad \text{Equation (3)}$$

FIG. 8 shows that the minimum number Lmin1 is assumed to be one (the minimum number Lmin1=1) and the routing track is a track where one wiring line can be wired in the Y direction, and that the number Lmax1 of the wiring lines equal to eight (the number Lmax1 of the wiring lines=8) can be divided into "Lmax1B=8/1=8" (eight).

(6-4) Step S64:

The number Lext1 of the wiring lines that are prohibited to be wired in the area specified by the information (a) of the basic input information F011 is calculated by subtracting the maximum number Lmax1 of the wiring lines that can be wired and obtained at step S62 from the total number La111 of the routing tracks obtained at step S61. The calculation Equation is shown as the following Equation (4).

$$L\text{ext}1=La111-L\text{max}1: \quad \text{Equation (4)}$$

FIG. 8 shows that the number Lext1 of the wiring lines that are prohibited to be wired is equal to "20−8=12" and the number Lext1 corresponds to a width of the routing prohibition region 300 generated in the X direction.

(6-5) Step S65:

The number Lext1 of the wiring lines that are prohibited to be wired, the number being obtained at step S64, is divided by the possible division number Lmax1B obtained at step S63, and thus the number SLext1 of the prohibited wiring lines included in the one division is calculated. The calculation Equation is shown as the following Equation (5).

$$SL\text{ext}1=L\text{ext}1/(L\text{max}1B-1): \quad \text{Equation (5)}$$

FIG. 9 shows that the number SLext1 of the prohibited wiring lines included in the one division is equal to "12/(8−1)=1.7≈2" and that the size (e.g., a width) in the X direction of the routing prohibition region 301 generated by dividing the region in the X direction is two routing tracks.

Subsequently, an operation procedure (step S66 to S610) of a different direction (the Y direction in the example of FIG. 4) from the routing direction specified by the information (b) of the basic input information F011 in the same wiring layer as that at steps S61 to S65 will be described. At steps S66 to S610, the calculation method is the same as the steps S61 to S65 described above.

(6-6) Step S66:

Using the coordinates ((X1, Y1), (X2, Y2)) of the information (a) of the area where the routing prohibition is generated in the basic input information F011 and the grid size Z of one routing track, the total number La112 of the routing tracks in the X direction is calculated by Equation (11).

$$La112=(Y2-Y1)/Z: \quad \text{Equation (11)}$$

FIG. 8 shows that twenty routing tracks, each extending toward the X direction are included.

(6-7) Step S67:

Using the coordinates of the information (a) of the basic input information F011 and the generation rate Psnt2 (here 50%) specified by the information (f) of the generation rate (%) at which the routing prohibition is generated in a different routing direction from the routing direction of the wiring layer that is an object of the routing prohibition of the additional input information F012, the maximum number Lmax2 of wiring lines able to be wired in the X direction when the routing prohibition region is generated is calculated by Equation (12).

$$L\text{max}2=(Y2-Y1)\times(1-\text{Psnt}2/100)/Z: \quad \text{Equation (12)}$$

FIG. 8 shows that the total number Lmax2 of the routing tracks is "20×(1−0.5)=10", that is, ten wiring lines can be wired to the twenty routing tracks in the X direction (the routing in the remaining ten routing tracks is prohibited).

(6-8) Step S68:

Using the minimum number Lmin2 of the wiring lines to be wired in the X direction between the adjacent routing prohibition region in the information (e) of the additional input information F012, the possible division number Lmax2B for insertion of the routing prohibition region is calculated, with respect to the maximum number Lmax2 of the wiring lines able to be wired in the X direction obtained at step S67, by Equation (13).

$$L\max 2B = L\max 2/L\min 2:  \quad \text{Equation (13)}$$

FIG. 8 shows that the minimum number Lmin2 is assumed to be one (the minimum number Lmin2=1) and the routing track is a track where one wiring line can be wired in the X direction, and that the number Lmax2 of the wiring lines equal to ten (the number Lmax2=10) can be divided into "Lmax2B=10/1=10" (ten).

(6-9) Step S69:

By subtracting the maximum number Lmax2 of the wiring lines obtained at step S67 from the total number La112 of the routing tracks in the X direction obtained at step S66, the number Lext2 of the wiring lines that are prohibited to be wired in the area specified by the information (a) of the basic input information F011 is calculated by the following Equation (14).

$$L\text{ext}2 = La112 - L\max 2:  \quad \text{Equation (14)}$$

FIG. 8 shows that the number Lext2 of the wiring lines that are prohibited to be wired in the X direction is equal to "20−10=10" and the number Lext2 corresponds to a width of the routing prohibition region 300 generated in the Y direction.

(6-10) Step S610:

The number Lext2 of the wiring lines that are prohibited to be wired, the number being obtained at step S69, is divided by the possible division number Lmax2B obtained at step S68, and thus the number SLext2 of the prohibited wiring lines included in the one division is calculated by the following Equation (15).

$$S L\text{ext}2 = L\text{ext}2/(L\max 2B - 1):  \quad \text{Equation (15)}$$

FIG. 9 shows that the number SLext2 of the prohibited wiring lines included in the one division is equal to "10/(10−1)=1.1≈1" and that the size (e.g., a length) in the Y direction of the routing prohibition region 301 generated by dividing the region in the Y direction is one routing track.

(6-11) Step S611:

The routing prohibition region generating information F02 is created on the basis of the basic input information F011, the additional input information F012, and the calculation results at steps S61 to S610. At first, the numbers SLext1 (Y direction) and SLext2 (X direction) of the prohibited wiring lines in the one division and the minimum numbers Lmin1 (Y direction) and Lmin 2 (X direction) of the wiring lines wired between the routing prohibition region are respectively multiplied by the one grid size Z of the wiring layer to be an object, thereby being changed into the width of the routing track. Then, the coordinate information is created. The coordinate information indicates data of the rectangles of the routing prohibition regions to be arranged at intervals of Lmin1×Z in the X direction and Lmin2×Z in the Y direction. The rectangle has the size of SLext1×Z in X direction and the size of SLext2×Z in Y direction when the wiring layer is in the X direction. The information of the wiring layer is added to the created coordinate information, and the information is outputted as the routing prohibition region generating information F02.

Next, referring to FIGS. 9 to 12, details of the process at step S12 in the flowchart according to the embodiment of FIG. 3B will be described.

FIGS. 9 to 12 show examples of results obtained by, when it is determined at step S11 that the routing error is not restored (step S11: No), carrying out again the series of processes at steps S4 to S11 after changing the routing prohibition region generation condition.

(13) Step S13:

In the case where it is determined at step S11 that the routing error is not restored (step S11: No), the reservation number of the routing resources is changed to be improved by increasing the number of the minimum numbers Lmin1 (Y direction) and Lmin2 (X direction) of the wiring lines to be wired between the adjacent routing prohibition regions. The increase of the minimum number of the wiring lines to be wired between the routing prohibition regions is carried out by setting the minimum number Lmin1 and Lmin2 of the wiring lines again as the increment number Cnt1 of the wiring lines in the Y direction and the increment number Cnt2 of the wiring lines in the X direction. The calculation equations are shown as the following Equations (6) and (16).

$$L\min 1 = L\min 1 + Cnt1:  \quad \text{Equation (6)}$$

$$L\min 2 = L\min 2 + Cnt2:  \quad \text{Equation (16)}$$

On this occasion, the processes (S13 to S14 and S4 to S11) after step S13 are repeated until it is determined that the routing error is restored at step S11. As for the increment numbers Cnt1 and Cnt2 of the wiring lines to be set at step S13, the minimum unit of the increment number Cnt1 of the wiring lines in the Y direction is set to one since the routing direction of the embodiment is the Y direction; however, the numbers may be set to two or more in consideration of the repetition count of the case where the total number of the routing tracks or a wiring line amount are large. The increment number Cnt2 of the wiring lines in the X direction different from the routing direction is set to zero or more.

(14) Step S14:

As described above, the processes (S13 to S14 and S4 to S11) after step S13 are repeated until it is determined at step S11 that the routing error is restored.

As the result of setting again the minimum numbers Lmin1 (the Y direction) and Lmin2 (the X direction) of the wiring lines to be wired between the routing prohibition regions at step S13, it is determined whether or not the number exceeds the values of the maximum numbers Lmax1 (the Y direction) and Lmax2 (the X direction) of the wiring lines that can be wired, the maximum numbers being calculated at step S62 and step S67. In the case of not exceeding the values of the maximum numbers Lmax1 (the Y direction) and Lmax2 (the X direction) (step S14: Yes), the flow proceeds to step S6, and re-calculation of the routing prohibition region generating information is carried out by using the values of the minimum numbers Lmin1 (the Y direction) and Lmin2 (the X direction) of the wiring lines to be wired between the routing prohibition regions, the minimum numbers being set again at step S13. In the case of exceeding the values of the maximum numbers Lmax1 (the Y direction) and Lmax2 (the X direction) (step S14: No), the flow proceeds to step S5, re-examination of the basic input information F011 is carried out.

Figure 10:
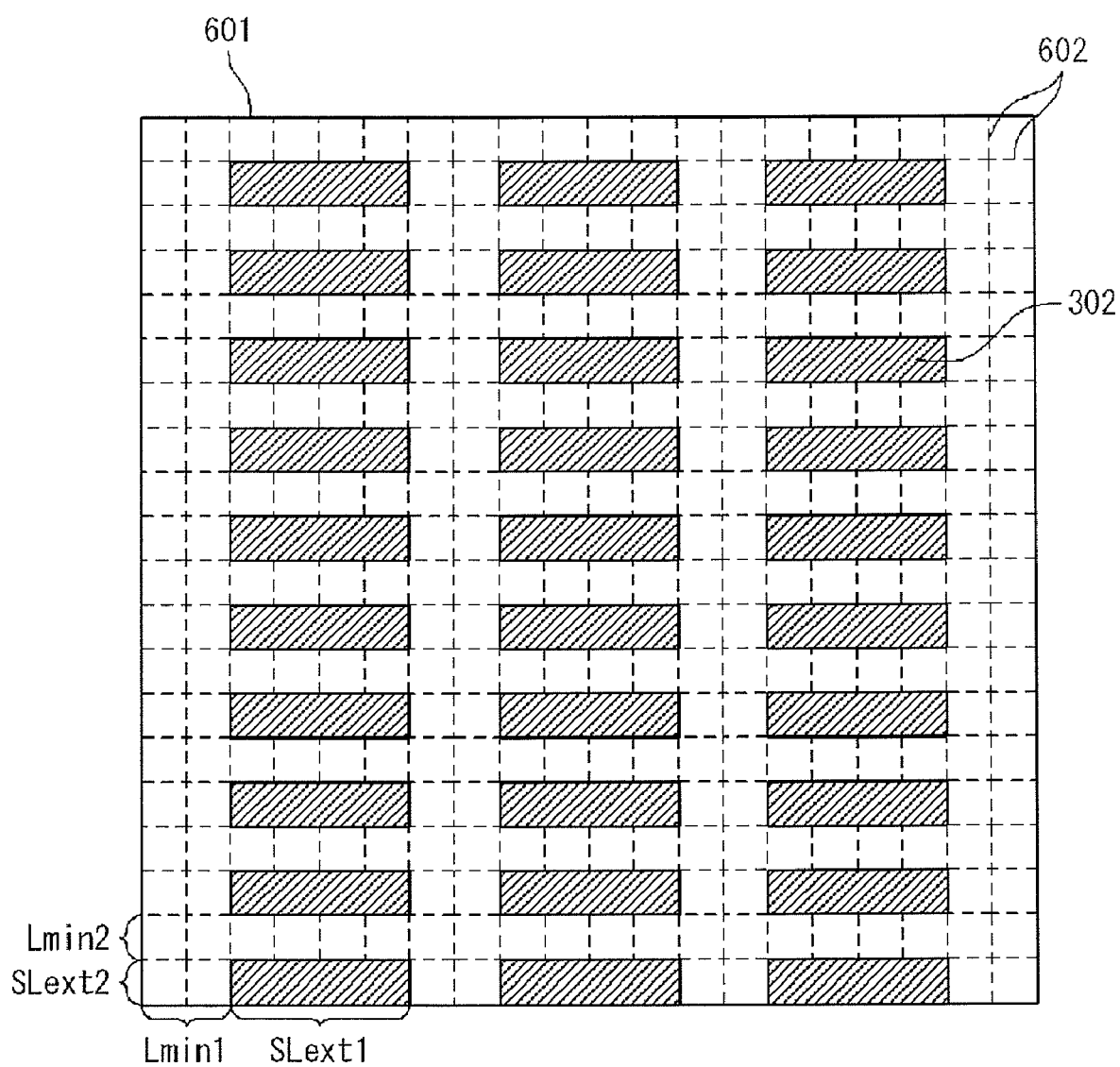
FIG. 10 is a schematic diagram describing one example of the generation process of the routing prohibition region at step S4 of FIG. 3A.

FIG. 9 shows the area 601 of the case where the routing prohibition regions 301 are generated by carrying out the processes from step S2 to S11 and where a first determination is carried out at step S11. Next, FIG. 10 shows the area 601 of the case where: it is determined that the routing error is not restored in FIG. 9 in the first determination at step S11 (step S11: No); the routing prohibition regions 302 are generated by setting again the numbers of Lmin1 (the Y direction) and Lmin2 (the X direction) of the wiring lines passing between the routing prohibition regions using the increment numbers Cnt1=1 (the Y direction) and Cnt2=0 (the X direction) at step S13; and then a second determination is carried out at step S11. In FIG. 9, though Lmin is equal to one (Lmin=1), Lmin is re-set to two (Lmin=2) in FIG. 10.

Figure 11:
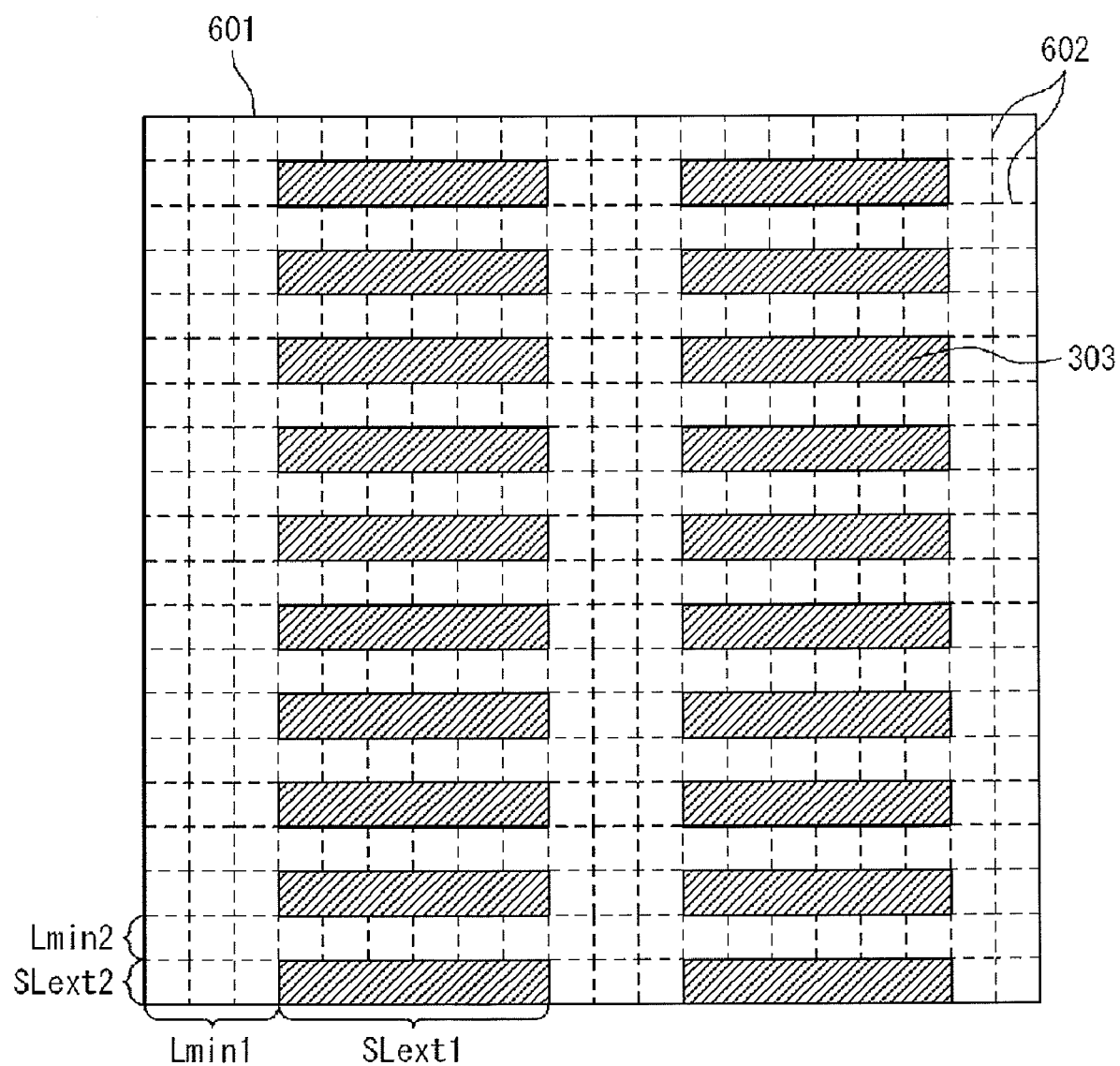
FIG. 11 is a schematic diagram describing one example of the generation process of the routing prohibition region at step S4 of FIG. 3A.
Figure 12:
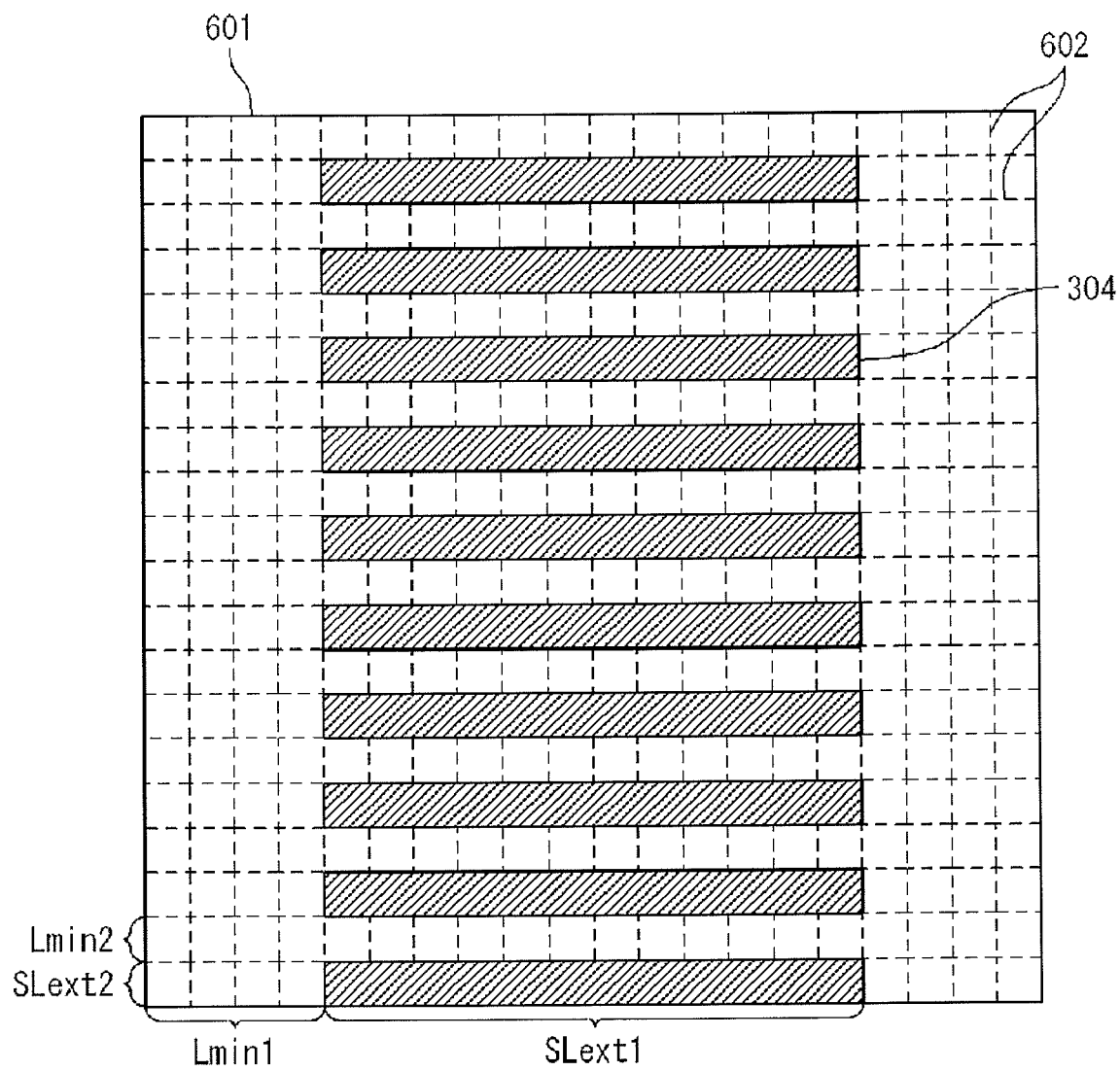
FIG. 12 is a schematic diagram describing one example of the generation process of the routing prohibition region at step S4 of FIG. 3A.

In the same manner, FIG. 11 shows an example of the area 601 of the case where the third determination is carried out at step S11. Moreover, FIG. 12 shows an example of the area 601 of the case where the fourth determination is carried out at step S11.

Referring to FIGS. 13 to 16, an example where: the routing prohibition region generating condition is changed at step S13 of FIG. 3B; it is determined at step S14 that the condition of the input information is not satisfied; and the routing error is restored by re-examining the input information, will be described next. Here, FIGS. 13 to 16 are schematic diagram describing the example where the routing error is restored. In FIGS. 13 to 16, the area 601 includes wiring lines N6 to N42 and routing prohibition regions 305 and 306.

Figure 13:
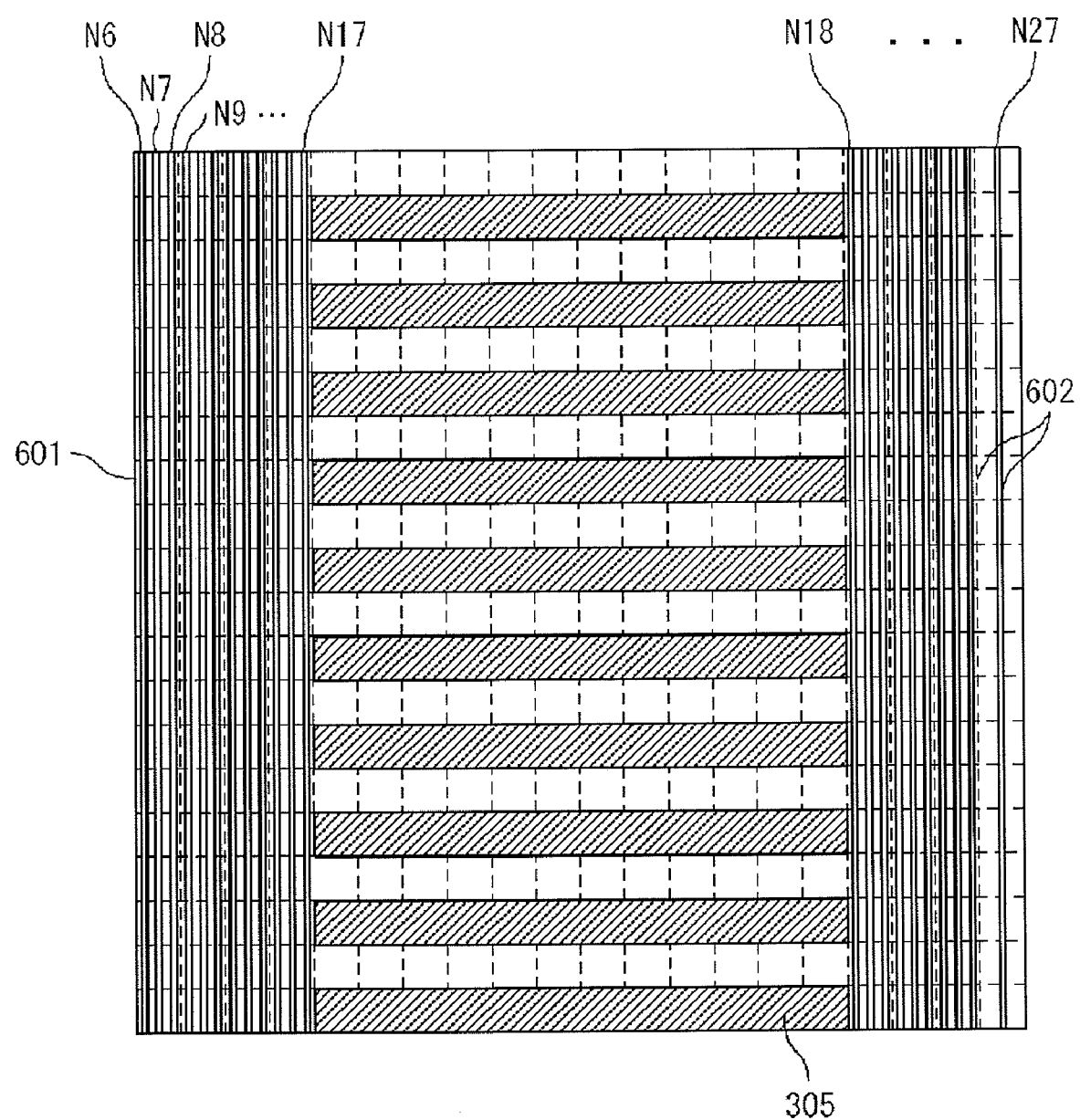
FIG. 13 is a schematic diagram describing an example of elimination of a routing error.

FIG. 13 shows the case where the routing prohibition regions 305 same as in FIG. 12 are generated at step S7 by setting: the generation rate Psnt1 of the routing prohibition region of the Y direction routing is equal to sixty (Psnt1=60); the minimum number Lmin1 of the wiring lines to be wired between the routing prohibition regions is four (Lmin1=4); the generation rate Psnt2 of the routing prohibition region of the X direction routing is equal to fifty (Psnt2=50); and the minimum number Lmin2 of the wiring lines to be wired between the routing prohibition regions is one (Lmin2=1). That is, FIG. 13 shows the state after the processes that: the routing error is not restored at step S11 (step S11: No); the generation condition of the routing prohibition region is changed at step S13; it is determined that the generation condition satisfies the condition of the input information at step S14; and then the processes of step S6 to step S10 are repeatedly carried out, which is shown in each of FIGS. 9 to 11.

FIG. 13 shows a result obtained by: changing the generation condition of the routing prohibition region at step S13 because the routing error was not restored at step S11 in the arrangement of the routing prohibition region of FIG. 11; obtaining the arrangement of the routing prohibition region of FIG. 12; and then carrying out re-estimation of the outline routing in consideration of the routing prohibition regions 305 at step S8. That is, FIG. 13 shows a state where the routing errors occur because three wiring lines N6, N7 and N8, three wiring lines N9, N10 and N11, three wiring lines N12, N13 and N14, three wiring lines N15, N16 and N17, three wiring lines N18, N19 and N20, three wiring lines N21, N22 and N23, and three wirings lines N24, N25 and N26 are wired in one routing track, respectively.

Figure 14:
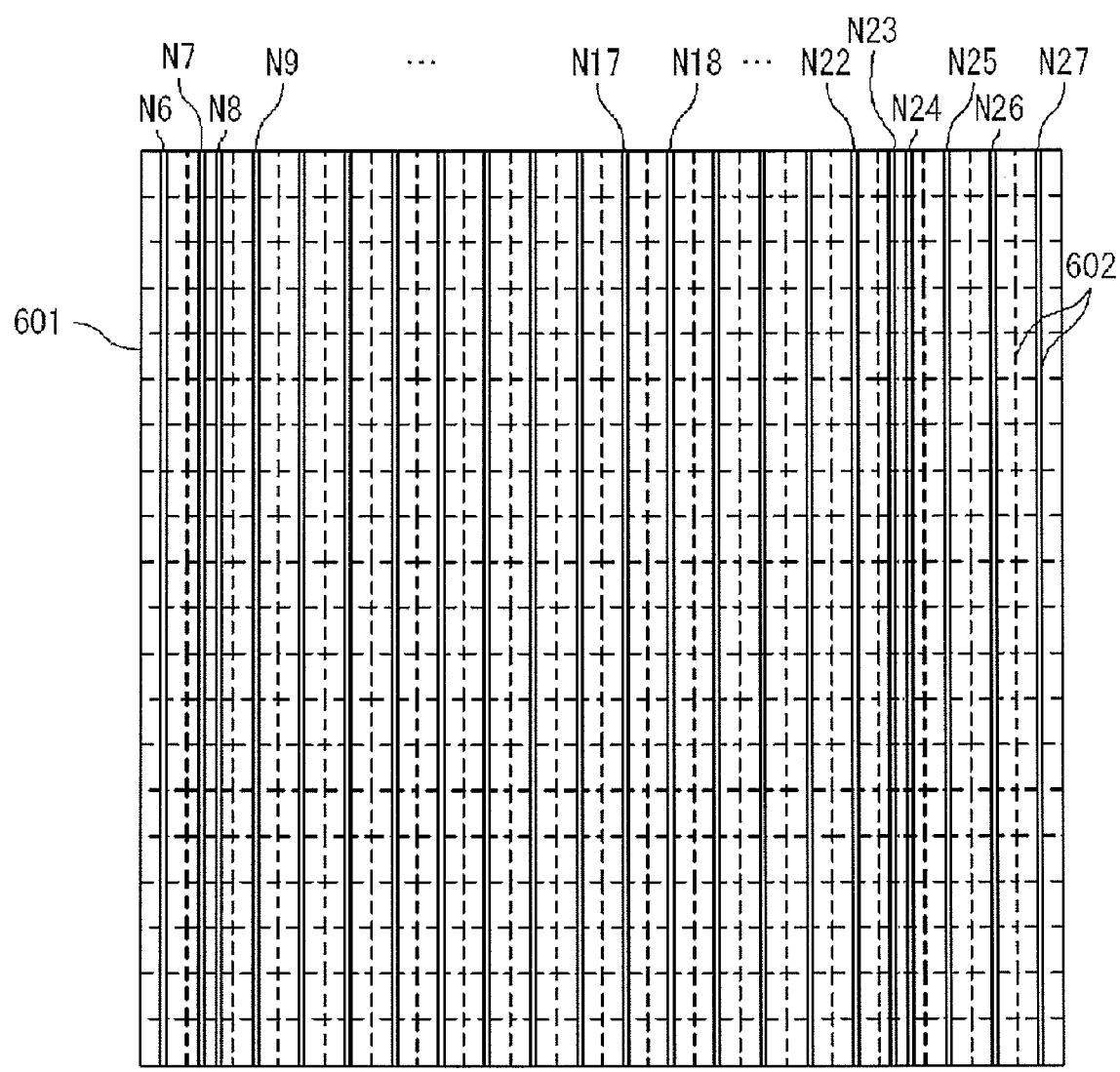
FIG. 14 is a schematic diagram describing the example of elimination of the routing error.

FIG. 14 shows a result obtained by: deleting the routing prohibition regions 305 at step S9; extracting the wiring crowding degree again at step S2; determining that there is no place with the high wiring crowding degree at step S3 to proceed to step 10; and then carrying out the detail routing. FIG. 14 shows a state where two wiring lines N7 and N8 and two wiring lines N23 and N24 are wired in one routing track, respectively. That is, the routing error still remains and thus it can be determined that the routing error could not be restored at step S11.

Next, the routing prohibition region generation condition is changed at step S12. Since the minimum number Lmin1 of the wiring lines to be wired between the routing prohibition regions cannot be changed to be 4 or more at the generation rate Psnt1=60 of the routing prohibition region of the Y direction routing in FIG. 13 at step S14, it is determined that the condition of the input information is not satisfied. Therefore, the flow returns to step S5 to create the input information again.

Specifically, FIG. 14 is under the same routing prohibition region generation condition as that of FIG. 12, and when the number Lmin1 (the Y direction) of the wiring lines passing between the routing prohibition regions is re-set up by setting the Cnt1 to one (Cnt1=1) in the Y direction, Lmin1 is equal to five (Lmin1=5). Lmax1B is equal to 1.6 (Lmax1B=1.6) based on Equation (3), and SLext1 is equal to 20 (SLext1=20) based on Equation (5). Thus, the numbers become larger than Lext1=12 obtained by Equation (4), thereby not satisfying the condition of the routing prohibition region generation rate of the information (c) of the basic input information F011. Accordingly, as the result of the determination at step S14, the flow proceeds to step S5 to change the condition of the input information.

Figure 15:
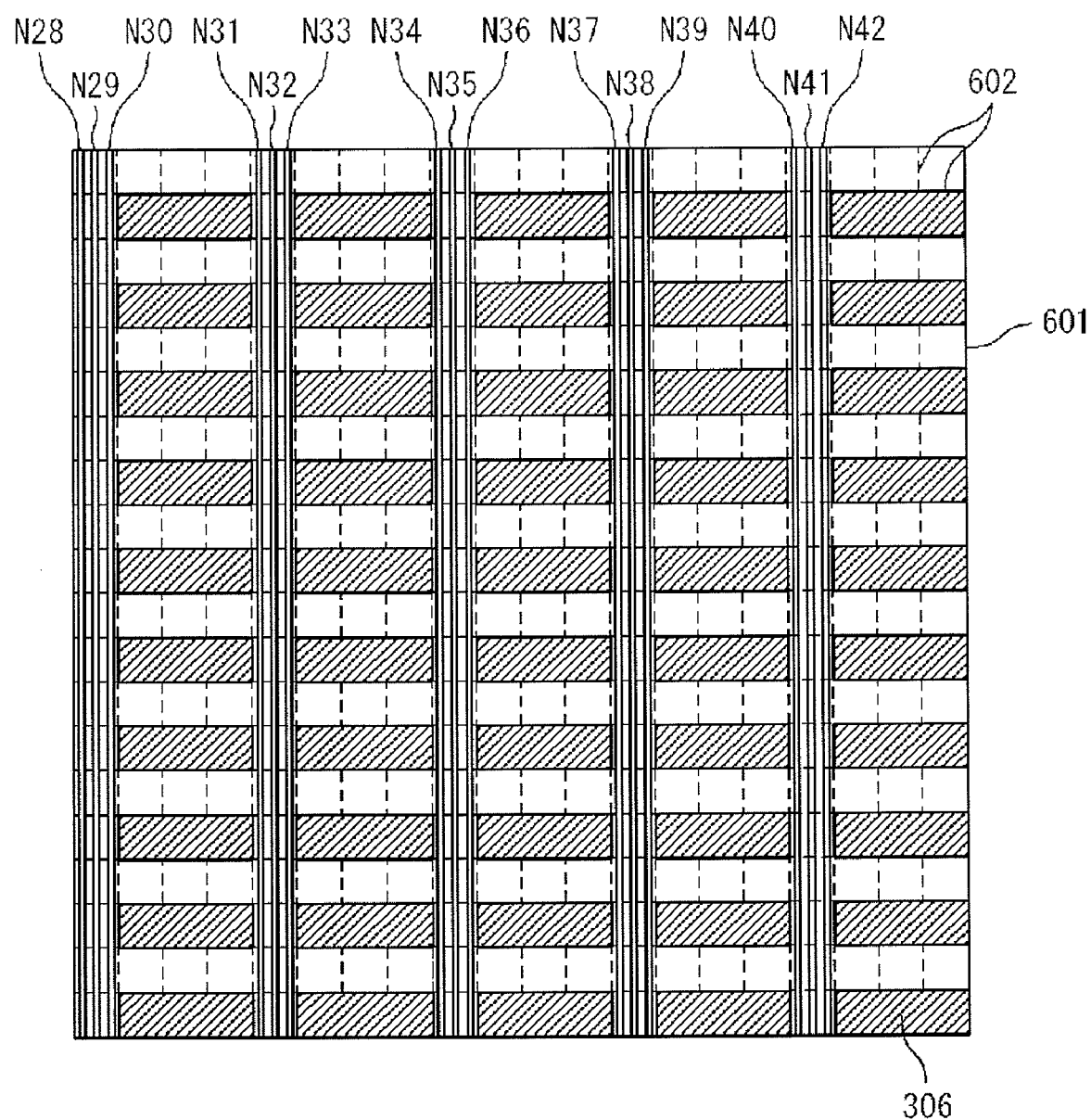
FIG. 15 is a schematic diagram describing the example of elimination of the routing error.

FIG. 15 is a diagram showing the state where: the input information is created again after returning to step S5; the generation rate Psnt1 of the routing prohibition region of the Y direction routing is changed; and then the routing prohibition regions 306 are generated. FIG. 15 shows the case where the routing prohibition regions 306 are generated at step S7 by changing the routing prohibition region generation rate of the Y direction routing from FIG. 13 to set: the generation rate Psnt1 of the routing prohibition region of the Y direction routing to 75 (Psnt1=75); the minimum number Lmin1 of the wiring lines to be wired between the routing prohibition regions to one (Lmin1=1); the generation rate Psnt2 of the routing prohibition region of the X direction routing to 50 (Psnt2=50); and the minimum number Lmin2 of the wiring lines to be wired between the routing prohibition regions to one (Lmin2=1).

Figure 16:
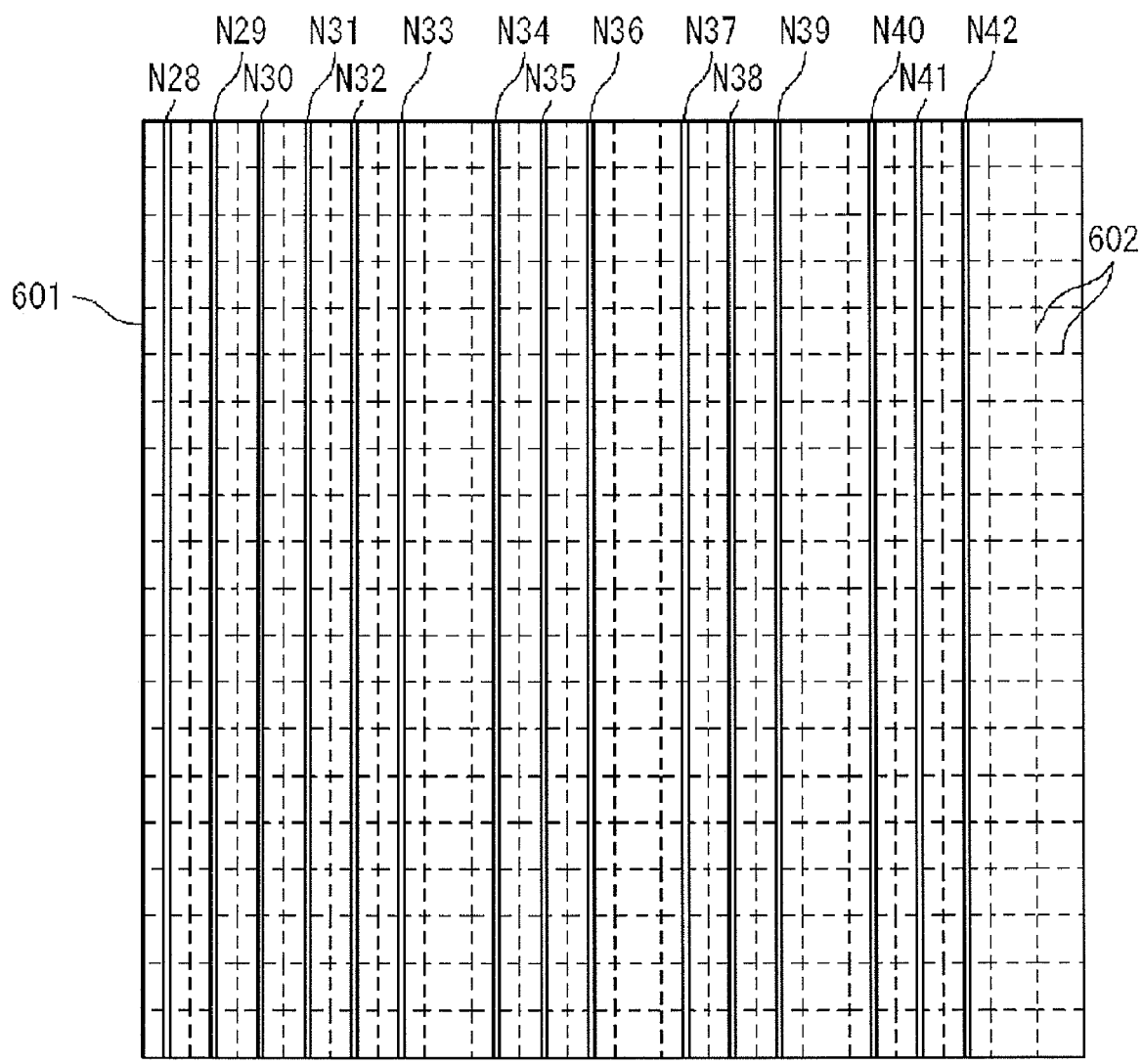
FIG. 16 is a schematic diagram describing the example of elimination of the routing error.

Next, a result of the re-estimation of the outline routing at step S8 in consideration of the routing prohibition region will be described. FIG. 15 shows a state where the routing errors occur because three wiring lines N28, N29 and N30, three wiring lines N31, N32 and N33, three wiring lines N34, N35 and N36, three wiring lines N37, N38 and N39, and three wiring lines N40, N41 and N42 are wired in one routing track, respectively. In the same manner as the descriptions of FIGS. 13 and 14, as a result of carrying out the detail routing at step S10 after the flow proceeds to step S9, step S2 and step S3, the routing error is restored by using the routing track reserved by arranging the routing prohibition region 306 as shown in FIG. 16.

In addition, in the above-mentioned example, the case is described in which the routing prohibition region generation information of the Y direction routing is created to one place with the high wiring crowding degree. However, when the information (a) of the routing prohibition generation region and the information (b) of the object wiring layer and the like of the basic input information F011 are changed and when respective variables (Lmin, Psnt, Cnt, Lmax, La11, Lext, and SLext) of the respective Equations corresponding to the information are prepared, a plural pieces of output information (F02) can be created, and the routing prohibition region can be configured on the basis of the plurality of conditions at the same time at step S7 of FIG. 3A.

As described above, the layout method of the semiconductor integrated circuit according to the embodiment of the present invention is carried out.

The present invention is the layout method that extracts the wiring crowding place after the placement of circuit elements and the routing of the semiconductor integrated circuit, generates the plurality of routing prohibition regions in an area including the wiring crowding place, carries out the routing by bypassing the plurality of the routing prohibition regions, deletes the plurality of routing prohibition regions, and carries out the re-routing. The layout method includes steps of: calculating a size (a width and/or a length) and an interval of the plurality of routing prohibition regions in consideration of the generation rate for generating the routing prohibition region in the area in each wiring layer and outputting a calculation result as the routing prohibition region generation information, in the generation of the routing prohibition region; and generating the plurality of routing prohibition regions in the area including the wiring crowding place on the basis of the routing prohibition region generation information. Specifically, routing resources can be dispersed to be reserved by arranging the plurality of routing prohibition regions in the wiring crowding place in a scattering manner. In the case where the re-routing is carried out after the plurality of routing prohibition regions is deleted, since the routing is carried out by using the separately arranged routing resources, a possibility that the wiring lines are crowded can be lowered, thereby reducing the degree of the crowding even if the wiring lines are crowded. As the result, a problem that the routing error remains after the detail routing and a problem that the routing error correction time is increased, caused by increase of the routing error due to the routing bypassing the routing prohibition region, can be solved.

The present invention has the above-mentioned features, and thereby generating the routing prohibition region 301 at the minimum interval Lmin1 of the wiring lines to be wired between the routing prohibition regions by using one grid width of the objective wiring layer as the minimum unit to the area 601 covering the wiring crowding place as shown in FIG. 9. Accordingly, the wiring crowding region is not entirely set to the routing prohibition as compared with the conventional technique. Thus, the minimum interval Lmin1 of the wiring lines to be wired between the routing prohibition regions can be used as the routing region in the area 601 after the generation of the routing prohibition regions 301. Then, the amount of wiring lines bypassing the area 601 in the outline routing at step S8 of FIG. 3A is smaller than that of the conventional example, the routing error between the bypassing wiring line and another wiring line can be reduced, and thus the number of routing errors can be suppressed, thereby shortening the routing error correction time in comparison with the conventional example.

The present invention is able to reduce the number of routing errors and shorten the routing error correction time. This is because: since the routing prohibition region is generated at the minimum interval of the wiring lines to be wired between the routing prohibition regions by using the one grid width of the objective wiring layer to the wiring crowding place, the wiring crowding region is not entirely set to the routing prohibition and the interval between the routing prohibition regions can be used as the routing region, and accordingly the amount of bypassing wiring lines is reduced, thereby reducing the routing error between the bypassing wiring line and another wiring line.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A layout method of a semiconductor integrated circuit, the layout method to be executed by a computer comprising a processor, the layout method comprising:
   extracting, by the computer comprising the processor, a wiring crowding place where wiring lines are crowded as compared with a predetermined condition, after carrying out a routing in a region where a placement of circuit elements of said semiconductor integrated circuit is carried out;
   generating a plurality of routing prohibition regions where a routing is prohibited in an area including said wiring crowding place;
   carrying out a routing by bypassing said plurality of routing prohibition regions;
   deleting said plurality of routing prohibition regions after said carrying out of said routing step; and
   carrying out a re-routing after said deleting step,
   wherein said generating step includes:
   calculating a size and an interval of said plurality of routing prohibition regions based on a rate for generating a routing prohibition region in said area in a wiring layer, and
   generating said plurality of routing prohibition regions in said area on the basis of said calculating result, the method further comprising:
   determining whether a routing error is restored after said carrying out of said re-routing step; and
   changing said size and said interval of said plurality of routing prohibition regions if said routing error is not restored,
   wherein said changing step, said generating step to said carrying out of said re-routing step, and said extracting step are performed repeatedly, until said routing error is restored.

2. The layout method according to claim 1, wherein at least one of a width and a length of each of said plurality of routing prohibition regions in said calculating step is equal to a width of one routing track.

3. The layout method according to claim 1, wherein said interval of each of said plurality of routing prohibition regions in said calculating step is equal to a width of one routing track.

4. The layout method according to claim 1, wherein after said deleting step is performed, said extracting step to said deleting step are performed repeatedly, until said wiring crowding place disappears.

5. The layout method according to claim 1, wherein at least one of a width and a length of each of said plurality of routing prohibition regions is changed in said changing step such that an incremental value equal to a width of one routing track is added.

6. The layout method according to claim 1, wherein said interval of each of said plurality of routing prohibition regions in said changing step is changed in said changing step such that an increment value equal to a width of one routing track is added.

7. A non-transitory computer-readable medium including a computer program for a layout method of a semiconductor integrated circuit, comprising code operable to control a computer, the code causing the computer to perform the method of:
   extracting a wiring crowding place where wiring lines are crowded as compared with a predetermined condition, after carrying out a routing in a region where a placement of circuit elements of said semiconductor integrated circuit is carried out;
generating a plurality of routing prohibition regions where a routing is prohibited in an area including said wiring crowding place;
carrying out a routing by bypassing said plurality of routing prohibition regions;
deleting said plurality of routing prohibition regions after said carrying out of said routing step; and
carrying out a re-routing after said deleting step,
wherein said generating step includes:
calculating a size and an interval of said plurality of routing prohibition regions based on a rate for generating a routing prohibition region in said area in a wiring layer, and
generating said plurality of routing prohibition regions in said area on the basis of said calculating result, the method further comprising:
determining whether a routing error is restored after said carrying out of said re-routing step; and
changing said size and said interval of said plurality of routing prohibition regions if said routing error is not restored,
wherein said changing step, said generating step to said carrying out of said re-routing step, and said extracting step are performed repeatedly, until said routing error is restored.

8. The tangible computer-readable medium according to claim 7, wherein at least one of a width and a length of each of said plurality of routing prohibition regions in said calculating step is equal to a width of one routing track.

9. The tangible computer-readable medium according to claim 7, wherein said interval of each of said plurality of routing prohibition regions in said calculating step is equal to a width of one routing track.

10. The tangible computer-readable medium according to claim 7, wherein after said deleting step is performed, said extracting step to said deleting step are performed repeatedly, until said wiring crowding place disappears.

11. The tangible computer-readable medium according to claim 7, wherein at least one of a width and a length of each of said plurality of routing prohibition regions is changed in said changing step such that an incremental value equal to a width of one routing track is added.

12. The tangible computer-readable medium according to claim 7, wherein said interval of each of said plurality of routing prohibition regions is changed in said changing step such that an increment value equal to a width of one routing track is added.

13. A layout device of a semiconductor integrated circuit, comprising:
a crowding extraction and determination portion configured to extract a wiring crowding place where wiring lines are crowded as compared with a predetermined condition, after carrying out a routing in a region where a placement of circuit elements of said semiconductor integrated circuit is carried out;
a prohibition region generating portion configured to generate a plurality of routing prohibition regions where a routing is prohibited in an area including said wiring crowding place;
a routing re-estimation portion configured to carry out a routing by bypassing said plurality of routing prohibition regions;
a prohibition region deletion portion configured to delete said plurality of routing prohibition regions after said routing by bypassing is carried out; and
a re-routing portion configured to carry out a re-routing after said plurality of routing prohibition regions is deleted,
wherein said prohibition region generating portion includes:
a prohibition region calculating portion configured to calculate a size and an interval of said plurality of routing prohibition regions based on a rate for generating a routing prohibition region in said area in a wiring layer, and
the prohibition region generating portion is configured to generate said plurality of routing prohibition regions in said area on the basis of said calculating result,
the layout device further comprising:
an error determination portion configured to determine whether a routing error is restored after said re-routing is carried out and
a prohibition region changing portion configured to change said size and said interval of said plurality of routing prohibition regions if said routing error is not restored,
wherein said prohibition region changing portion, said prohibition region generating portion, said routing re-estimation portion, said prohibition region deletion portion, said re-routing portion, and said crowding extraction and determination portion operate repeatedly, until said routing error is restored.

14. The layout device according to claim 13, wherein at least one of a width and a length of each of said plurality of routing prohibition regions, calculated by said prohibition region calculating portion, is equal to a width of one routing track.

15. The layout device according to claim 13, wherein said interval of each of said plurality of routing prohibition regions, calculated by said prohibition region calculating portion, is equal to a width of one routing track.

16. The layout device according to claim 13, wherein after said prohibition region deletion portion deletes said plurality of routing prohibition regions, said crowding extraction and determination portion, said prohibition region generating portion, said routing re-estimation portion and said prohibition region deletion portion operate repeatedly, until said wiring crowding place disappears.

17. The layout device according to claim 13, wherein at least one of a width and a length of each of said plurality of routing prohibition regions, changed by said prohibition region changing portion, is changed such that an incremental value equal to a width of one routing track is added.

18. The layout device according to claim 13, wherein said interval of each of said plurality of routing prohibition regions, changed by said prohibition region changing portion, is changed such that an increment value equal to a width of one routing track is added.

* * * * *

UNITED STATES PATENT AND TRADEMARK OFFICE
CERTIFICATE OF CORRECTION

PATENT NO. : 8,402,415 B2  
APPLICATION NO. : 13/039955  
DATED : March 19, 2013  
INVENTOR(S) : Sawako Fukunaga et al.

Page 1 of 1

It is certified that error appears in the above-identified patent and that said Letters Patent is hereby corrected as shown below:

In the Specifications

Column 10, Line 11: delete "prohibit ion" and insert -- prohibition --

Column 19, Line 67: delete "pre sent" and insert -- present --

In the Claims

Column 20, Line 57: In Claim 6, after "regions" delete "in said changing step"

Column 22, Line 23: In Claim 13, delete "out" and insert -- out; --

Signed and Sealed this  
Sixth Day of May, 2014

Michelle K. Lee  
*Deputy Director of the United States Patent and Trademark Office*